US010825778B2

(12) United States Patent
Bae et al.

(10) Patent No.: US 10,825,778 B2
(45) Date of Patent: Nov. 3, 2020

(54) SEMICONDUCTOR PACKAGE HAVING MARK WITH IDENTIFICATION INFORMATION

(71) Applicant: SAMSUNG ELECTRONICS CO., LTD., Suwon-si (KR)

(72) Inventors: Sung Hawn Bae, Suwon-si (KR); Pyung Hwa Han, Suwon-si (KR); Jung Soo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/371,653

(22) Filed: Apr. 1, 2019

(65) Prior Publication Data

US 2020/0105679 A1 Apr. 2, 2020

(30) Foreign Application Priority Data

Oct. 2, 2018 (KR) .................. 10-2018-0117772

(51) Int. Cl.
*H01L 23/544* (2006.01)
*H01L 23/00* (2006.01)
*H01L 23/495* (2006.01)
*H01L 23/538* (2006.01)
(Continued)

(52) U.S. Cl.
CPC ........ *H01L 23/544* (2013.01); *H01L 23/3107* (2013.01); *H01L 23/4952* (2013.01); *H01L 23/5226* (2013.01); *H01L 23/5386* (2013.01); *H01L 24/09* (2013.01); *H01L 24/33* (2013.01); *H01L 24/49* (2013.01); *H01L 2223/54406* (2013.01); *H01L 2223/54433* (2013.01); *H01L 2224/02331* (2013.01); *H01L 2224/02372* (2013.01); *H01L 2224/02377* (2013.01); *H01L 2224/02379* (2013.01)

(58) Field of Classification Search
None
See application file for complete search history.

(56) References Cited

U.S. PATENT DOCUMENTS 10,096,553 B2 * 10/2018 Su ...................... H01L 21/4842
2012/0313265 A1 12/2012 Yamanishi
(Continued)

FOREIGN PATENT DOCUMENTS

JP 2012-256741 A 12/2012

*Primary Examiner* — J. E. Schoenholtz
*Assistant Examiner* — Joe Schoenholtz
(74) *Attorney, Agent, or Firm* — Sughrue Mion, PLLC

(57) ABSTRACT

A semiconductor package includes: a connection member having a first surface and a second surface opposing each other, and including a first redistribution layer; a semiconductor chip disposed on the first surface of the connection member and having connection pads connected to the first redistribution layer; an encapsulant disposed on the first surface of the connection member and encapsulating the semiconductor chip; a wiring structure connected to the first redistribution layer and extending in a thickness direction of the encapsulant; a second redistribution layer disposed on the encapsulant and connected to the wiring structure; and a mark disposed on the encapsulant and including a plurality of metal patterns providing identification information and a circuit line connected to the second redistribution layer.

26 Claims, 20 Drawing Sheets

(51) Int. Cl.
*H01L 23/31* (2006.01)
*H01L 23/522* (2006.01)

(56) References Cited

U.S. PATENT DOCUMENTS

| | | | |
|---|---|---|---|
| 2015/0348912 A1* | 12/2015 | Su | H01L 21/4842 |
| | | | 257/666 |
| 2016/0064334 A1 | 3/2016 | Bishop | |
| 2017/0040265 A1* | 2/2017 | Park | H01L 24/19 |
| 2017/0125355 A1* | 5/2017 | Su | H01L 21/4842 |

\* cited by examiner

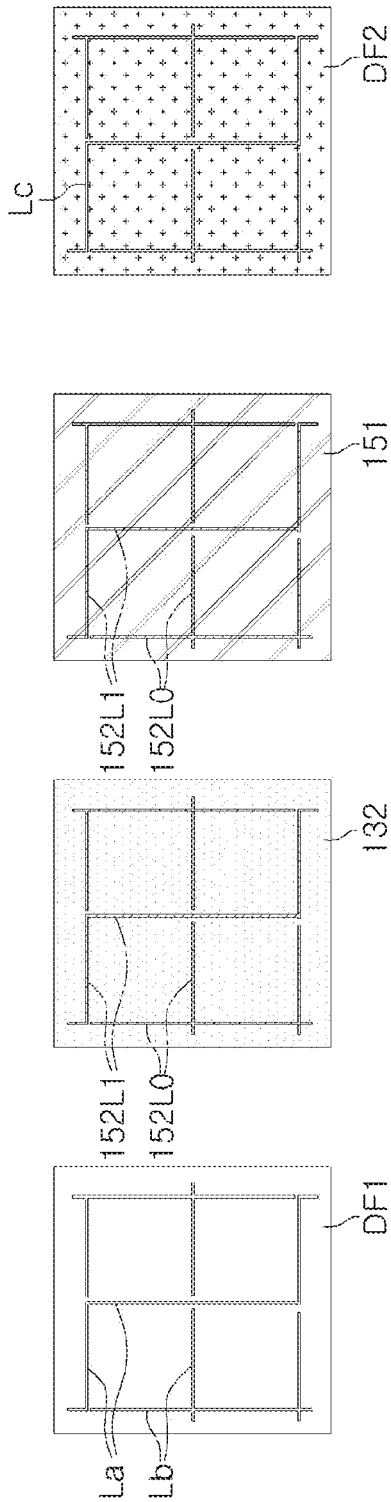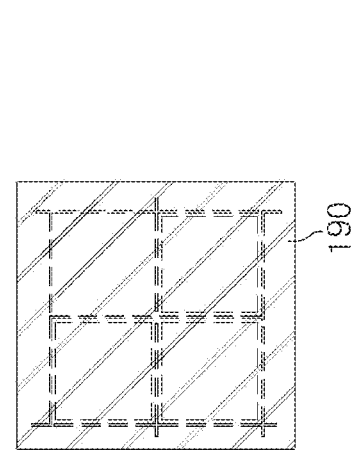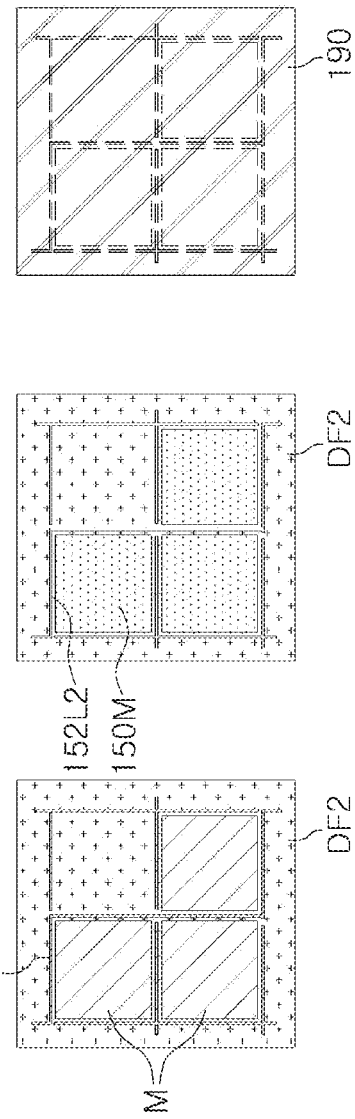

SEMICONDUCTOR PACKAGE HAVING MARK WITH IDENTIFICATION INFORMATION

CROSS-REFERENCE TO RELATED APPLICATION(S)

This application claims benefit of priority to Korean Patent Application No. 10-2018-0117772 filed on Oct. 2, 2018 in the Korean Intellectual Property Office, the disclosure of which is incorporated herein by reference in its entirety.

TECHNICAL FIELD

The present disclosure relates to a semiconductor package.

BACKGROUND

One of recent major trends in development of semiconductor chip technology is to reduce a size of a component. As a result, a semiconductor package is required to have a compact size, and, at the same time, implement a plurality of pins in accordance with a rapid increase in demand for a compact semiconductor chip, and the like, even in the field of package technology.

One type of package technology suggested to satisfy the technical demand described above, is a fan-out package. Such a fan-out package may have a compact size and allow a plurality of pins to be implemented by redistributing electrical connection structures outwardly of a region in which a semiconductor chip is disposed.

SUMMARY

An aspect of the present disclosure may provide a semiconductor package having a mark with identification information.

According to an aspect of the present disclosure, a semiconductor package may include: a connection member having a first surface and a second surface opposing each other, and including a first redistribution layer; a semiconductor chip disposed on the first surface of the connection member and having connection pads connected to the first redistribution layer; an encapsulant disposed on the first surface of the connection member and encapsulating the semiconductor chip; a wiring structure connected to the first redistribution layer and extending in a thickness direction of the encapsulant; a second redistribution layer disposed on the encapsulant and connected to the wiring structure; and a mark disposed on the encapsulant and including a plurality of metal patterns providing identification information and a circuit line connected to the second redistribution layer.

According to another aspect of the present disclosure, a semiconductor package may include: a first connection member having a first surface and a second surface opposing each other, and including a first redistribution layer; a frame disposed on the first surface of the first connection member and having a cavity; a wiring structure connected to the first redistribution layer and penetrating through an upper surface and a lower surface of the frame; a semiconductor chip disposed on the first surface of the first connection member and disposed in the cavity of the frame and having connection pads connected to the first redistribution layer; an encapsulant disposed on the first surface of the first connection member and encapsulating the semiconductor chip; a second connection member disposed on the encapsulant and including a second redistribution layer connected to the wiring structure; and a mark disposed on the second connection member on the same level as a level on which the second redistribution layer is disposed, and formed of a metal, wherein the mark includes a plurality of metal patterns arranged to form a two-dimensional barcode and a plurality of line patterns forming a lattice surrounding the plurality of metal patterns, and at least one line pattern of the plurality of line patterns is connected to the second redistribution layer to be provided as a circuit line for the second redistribution layer.

According to another aspect of the present disclosure, a semiconductor package may include: a connection member having a first surface and a second surface opposing each other, and including a first redistribution layer; a semiconductor chip disposed on the first surface of the connection member and having connection pads connected to the first redistribution layer; an encapsulant disposed on the first surface of the connection member and encapsulating the semiconductor chip; a wiring structure connected to the connection pads of the semiconductor chip through at least the first redistribution layer and extending in a thickness direction of the encapsulant; a second redistribution layer disposed on the encapsulant and connected to the wiring structure; a mark region including a plurality of metal patterns disposed on a level the same as that of the second redistribution layer with respect to an active surface of the semiconductor chip; and a circuit line disposed on a level the same as that of the second redistribution layer and the plurality of metal patterns with respect to the active surface of the semiconductor chip, crossing the mark region, electrically isolated from the metal patterns, and electrically connected to the second redistribution layer.

BRIEF DESCRIPTION OF DRAWINGS

The above and other aspects, features, and advantages of the present disclosure will be more clearly understood from the following detailed description taken in conjunction with the accompanying drawings, in which:

FIGS. 17A through 17G are plan views for describing main processes of forming an identification mark according to an exemplary embodiment in the present disclosure.

DETAILED DESCRIPTION

Hereinafter, exemplary embodiments of the present disclosure will now be described in detail with reference to the accompanying drawings.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

Electronic Device

Figure 1:
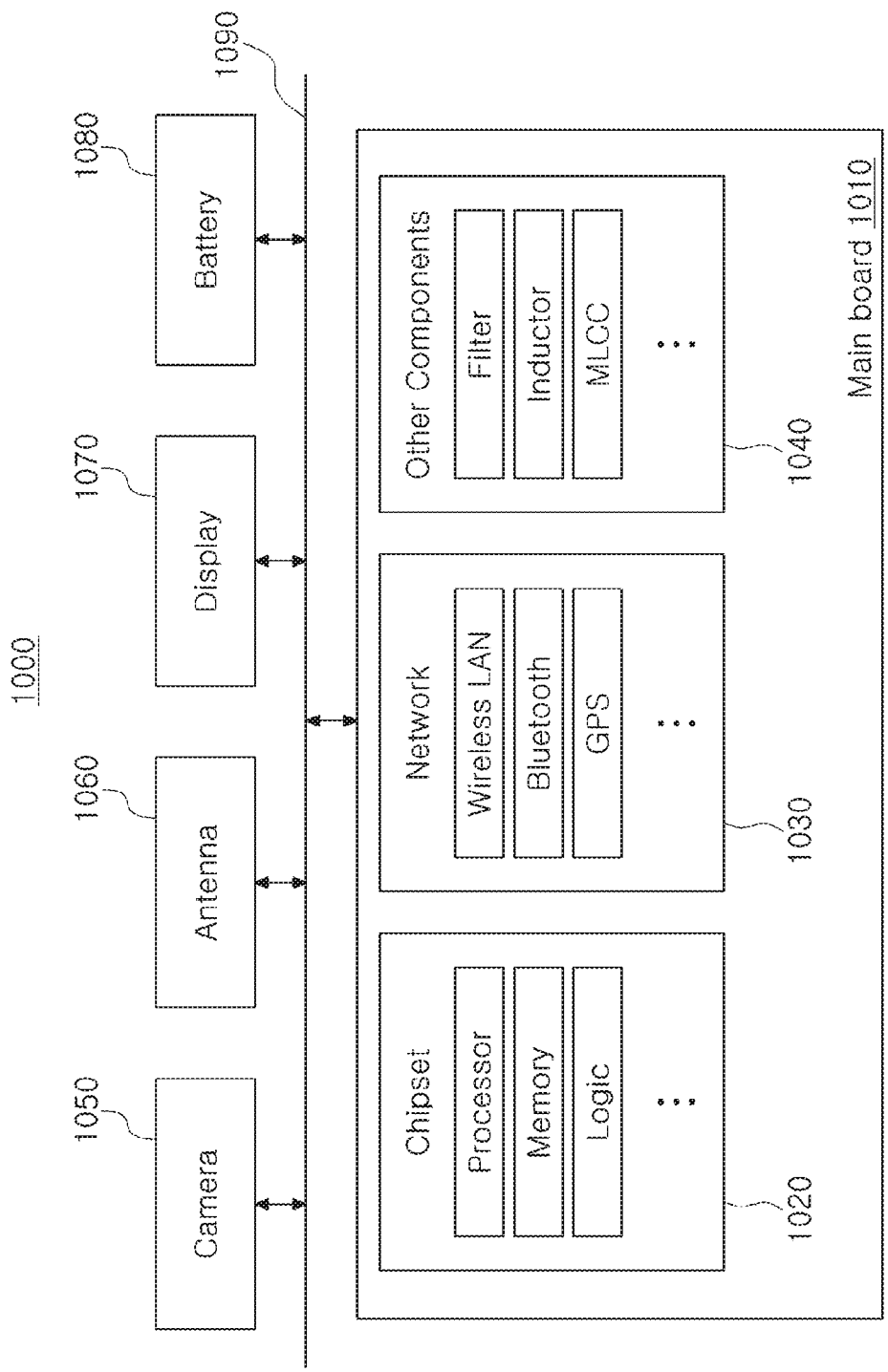
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
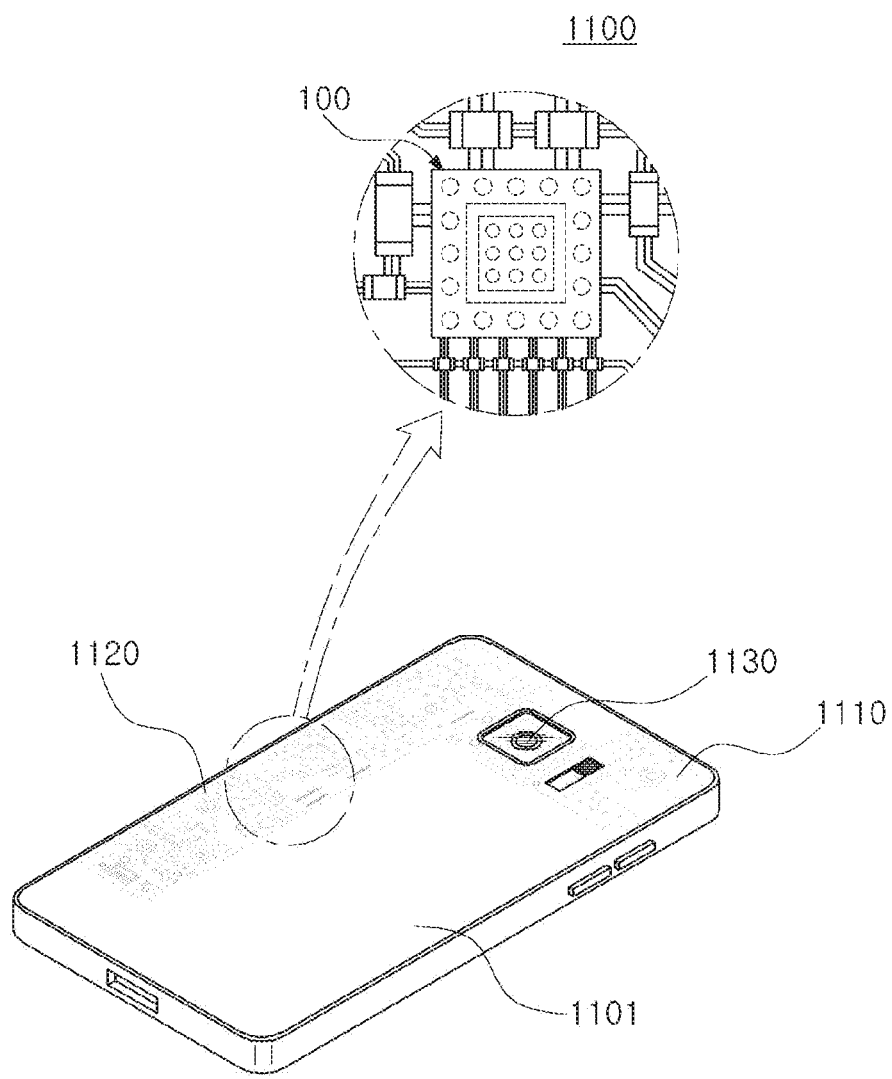
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and use of packaging technology for buffering a difference in a circuit width between the semiconductor chip and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
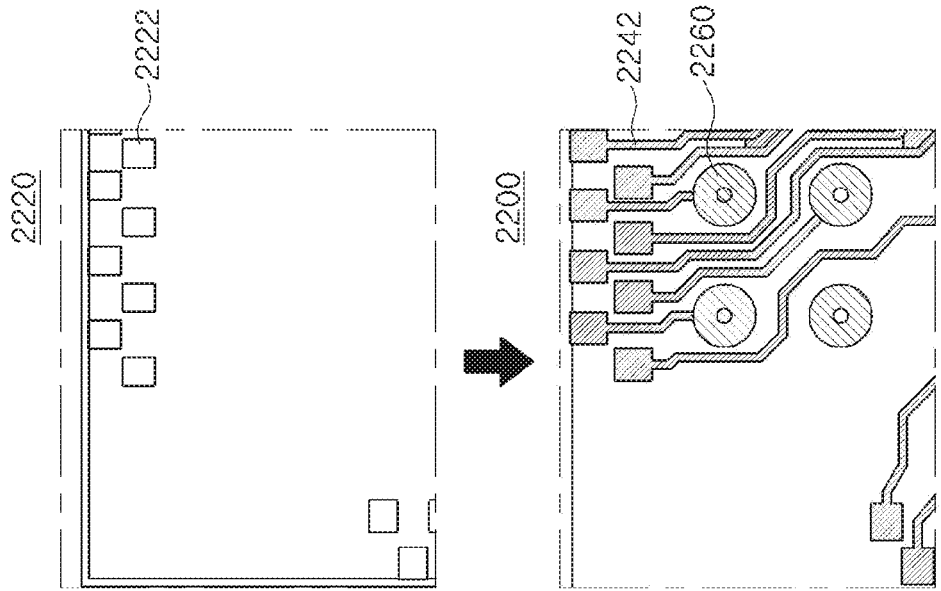
FIGS. 3A and 3B are schematic cross-sectional views illustrating a fan-in semiconductor package before and after being packaged.
Figure 3A:
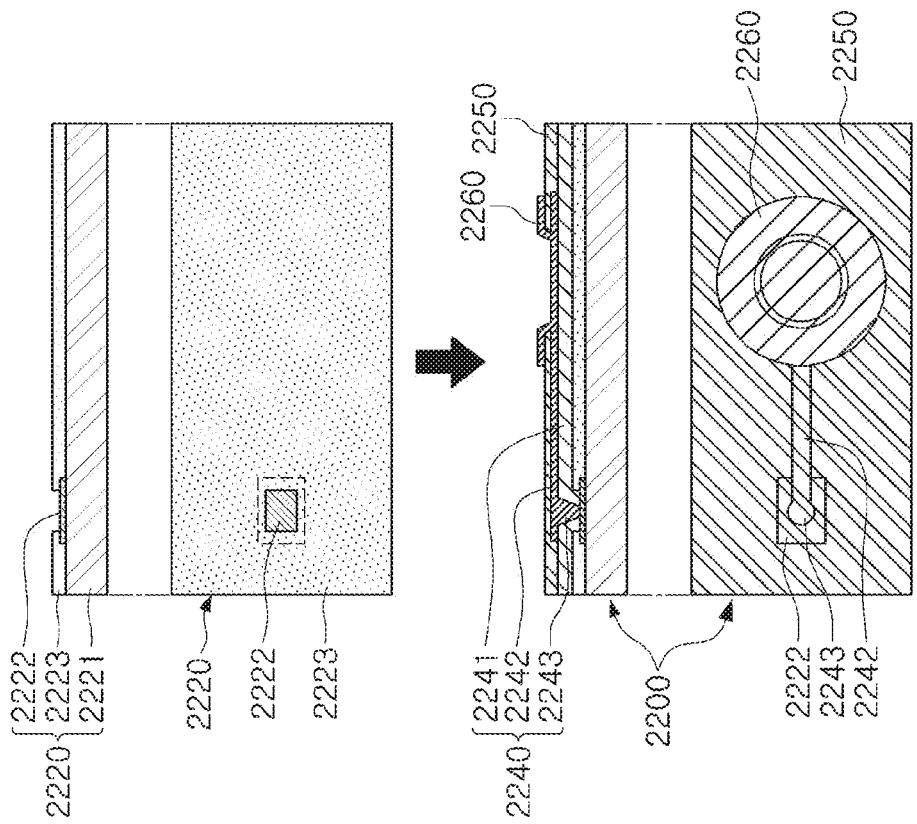
Figure 4:
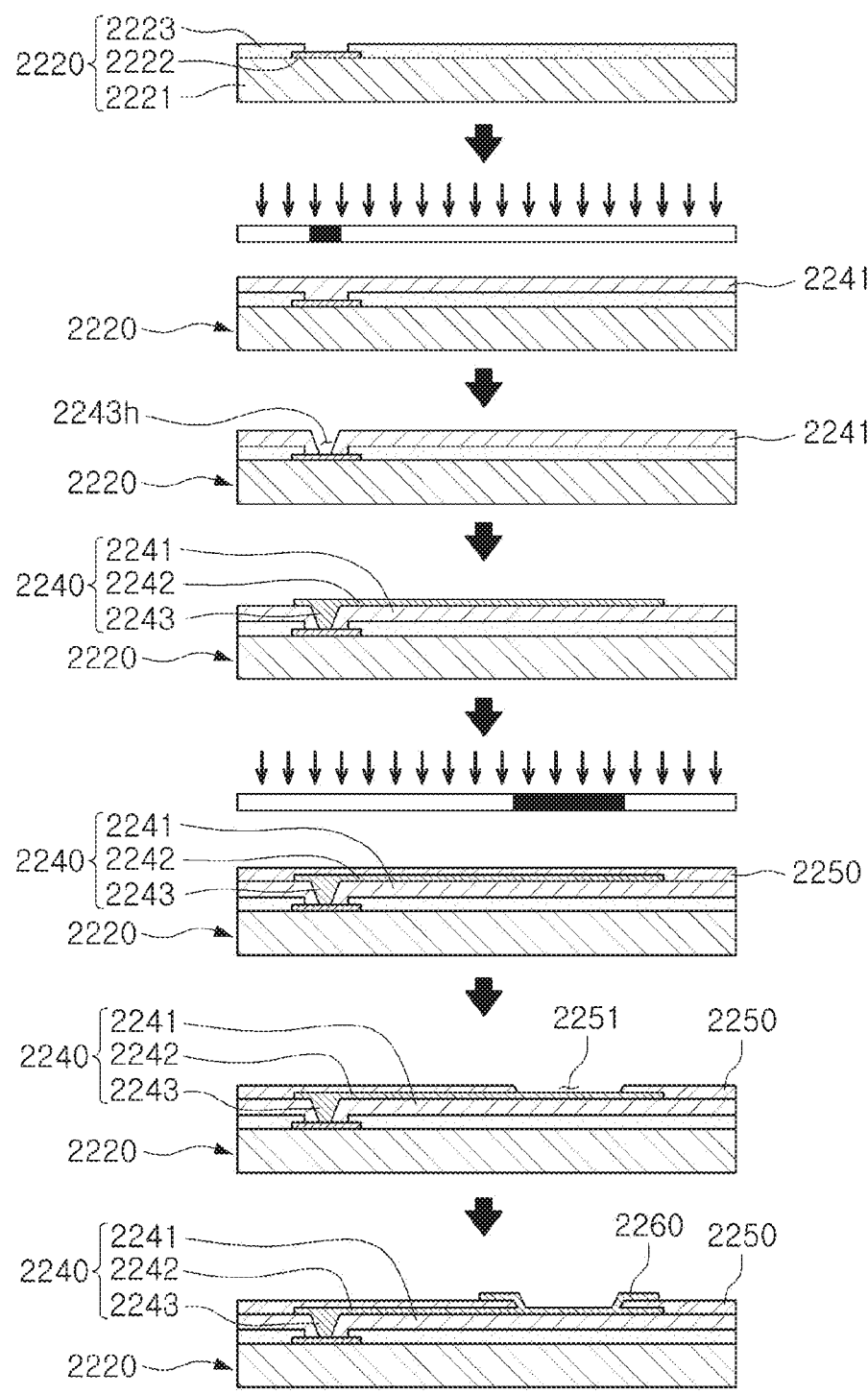
FIG. 4 is schematic cross-sectional views illustrating a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
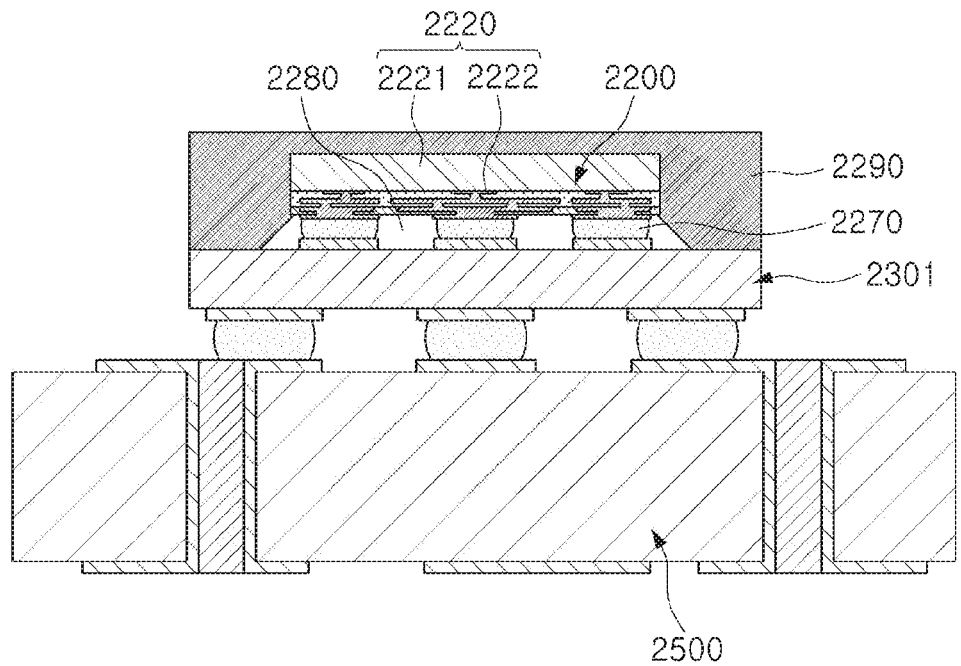
FIG. 5 is a schematic cross-sectional view illustrating a fan-in semiconductor package mounted on an interposer substrate that is ultimately mounted on a main board of an electronic device.
Figure 6:
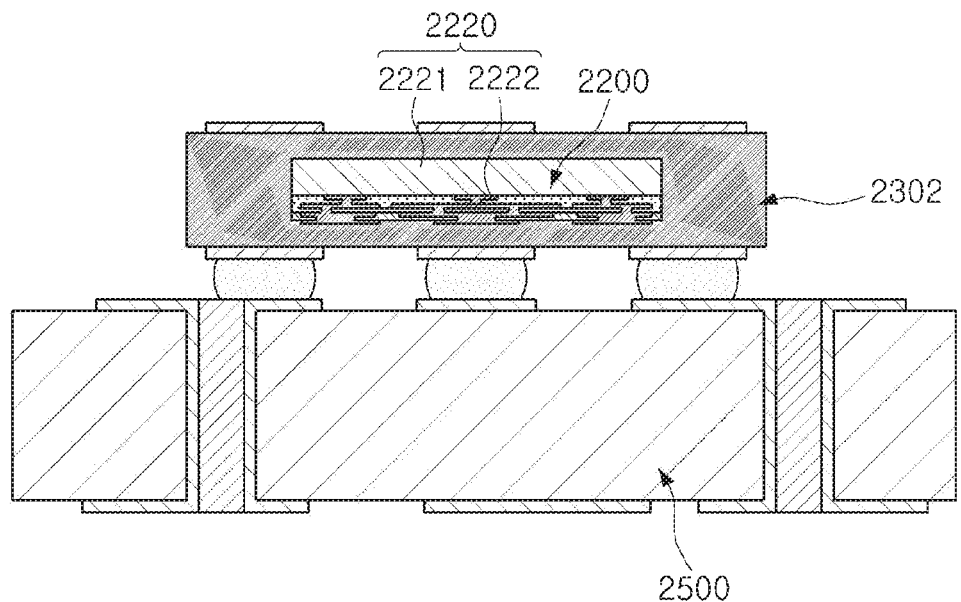
FIG. 6 is a schematic cross-sectional view illustrating a fan-in semiconductor package embedded in an interposer substrate that is ultimately mounted on a main board of an electronic device.

FIG. 5 is a schematic cross-sectional view illustrating a fan-in semiconductor package mounted on an interposer substrate that is ultimately mounted on a main board of an electronic device, and FIG. 6 is a schematic cross-sectional view illustrating a fan-in semiconductor package embedded in an interposer substrate that is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, low melting point metals or solder balls 2270, or the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
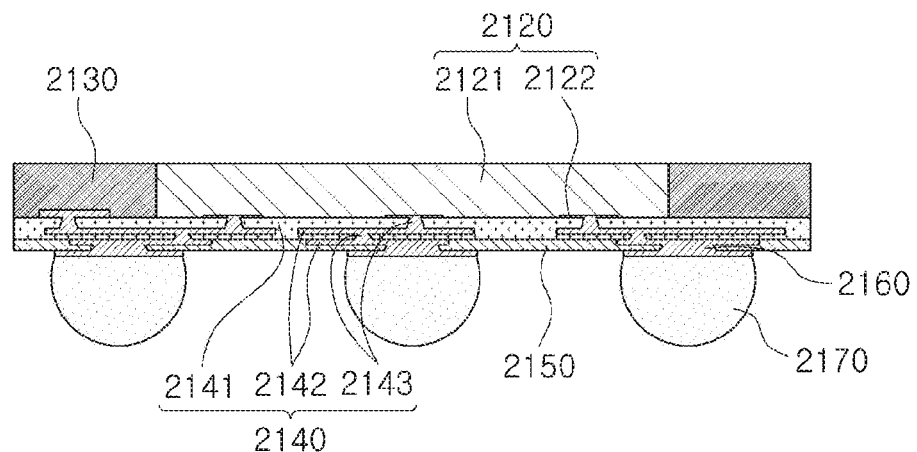
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Low melting point metals or solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed after encapsulating the semiconductor chip 2120, and thus each of the vias 2143 connected to the redistribution layers may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip (e.g., outwardly from the footprint of the semiconductor chip) through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
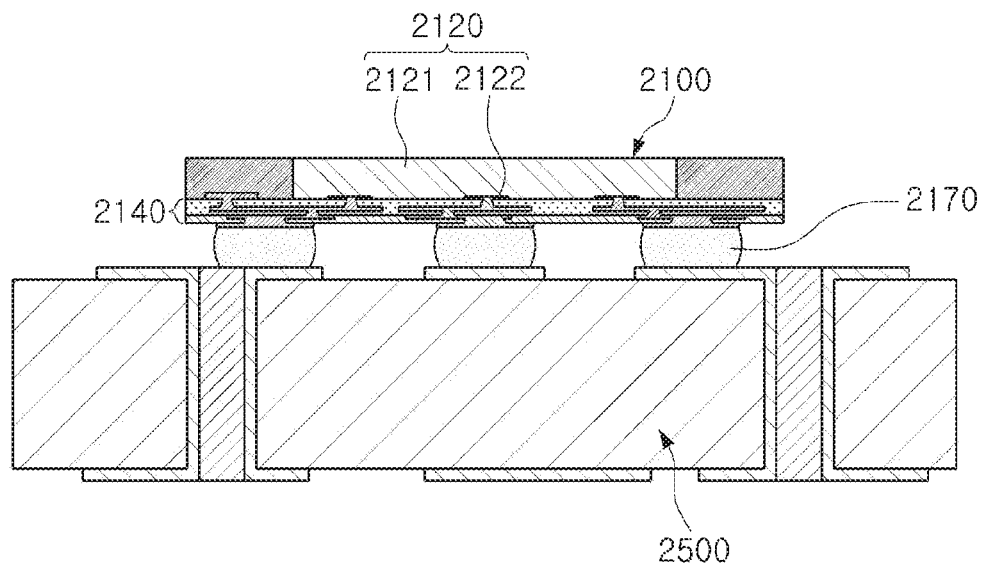
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through low meting point metals or solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
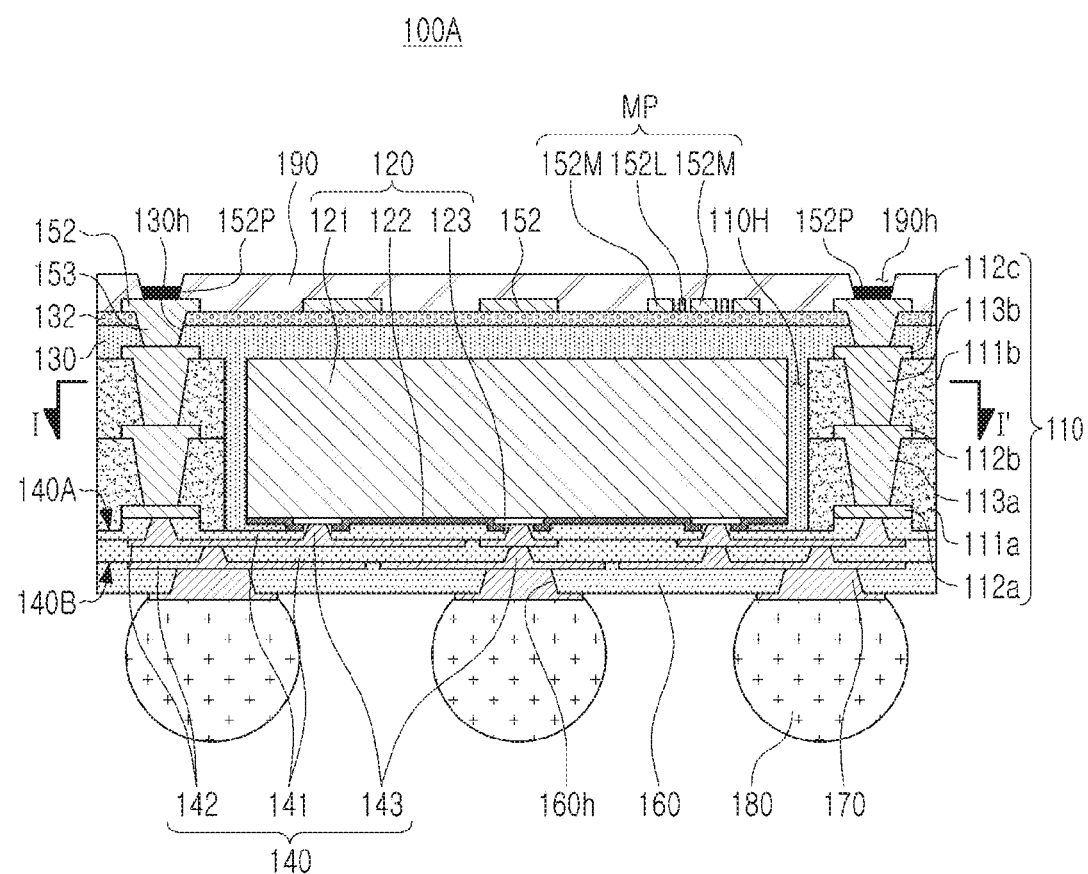
FIG. 9 is a schematic cross-sectional view illustrating a semiconductor package according to an exemplary embodiment in the present disclosure.
Figure 10:
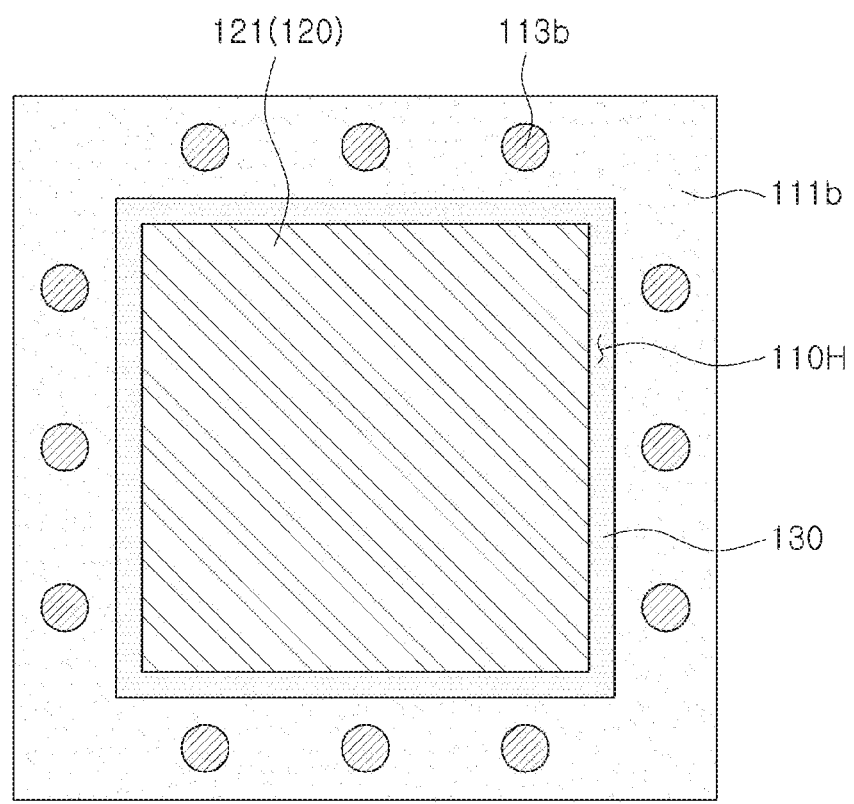
FIG. 10 is a plan view taken along line I-I' of the semiconductor package of FIG. 9.

FIG. 9 is a schematic cross-sectional view illustrating a semiconductor package according to an exemplary embodiment in the present disclosure, and FIG. 10 is a plan view taken along line I-I' of the semiconductor package of FIG. 9.

Referring to FIGS. 9 and 10, a semiconductor package 100A according to the exemplary embodiment may include a connection member 140 having a first surface 140A and a second surface 140B opposing each other, a semiconductor chip 120 disposed on the first surface 140A of the connection member 140, and an encapsulant 130 disposed on the first surface 140A of the connection member 140 and encapsulating the semiconductor chip 120.

The connection member 140 may include two first redistribution layers 142, and connection pads 122 of the semiconductor chip 120 disposed on the first surface 140A of the connection member 140 may be connected to the first redistribution layers 142.

A frame 110 may be disposed on the first surface 140 of the connection member 140, and the semiconductor chip 120 may be accommodated in a cavity 110H of the frame 110. The frame 110 may have a wiring structure including three wiring layers 112a, 112b, and 112c, and wiring vias 113a and 113b connecting the wiring layers 112a, 112b, and 112c to one another. The wiring structure of the frame 110 may be connected to the first redistribution layers 142 of the connection member 140.

A first passivation layer 160 may be formed on the second surface 140B of the connection member 140. The first passivation layer 160 may have openings 160h exposing at least portions of the first redistribution layer 142. Underbump metal layers 170 may be disposed in the openings 160h, respectively, and may be connected to electrical connection metals 180, respectively.

The encapsulant 130 may encapsulate the semiconductor chip 120 accommodated in the cavity 110H, and the encapsulant 130 may have an extending region extending to an upper surface of the frame 110. An insulating layer 132 may cover the extending region of the encapsulant 130. The extending region of the encapsulant 130 and the insulating layer 132 may have an opening 130h exposing at least a portion of the uppermost wiring layer 112c. A second redistribution layer (also referred to as a backside redistribution layer) 152 may be formed on the insulating layer 132. The second redistribution layer 152 may be connected to the uppermost wiring layer 112c through a second redistribution via 153 formed in the opening 130h.

As a second passivation layer 190, a transparent resin layer may be formed in order to secure visibility of a mark MP formed on the insulating layer 132. The second passivation layer 190 may be formed of a transparent insulating resin such as a PID resin. For example, the second passivation layer 190 may have an opening 190h exposing at least a portion of the second redistribution layer 152, and a surface treatment layer 152P may be formed on the opened portion of the second redistribution layer 152. The surface treatment layer 152P is not particularly limited thereto, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

In such a structure, the first redistribution layers 142 of the connection member 140 may be connected to the connection pads 122 of the semiconductor chip 120, and may also be connected to the second redistribution layer 152 disposed at an upper portion (or backside) of the semiconductor package 100A through the wiring structure. As described above, a backside circuit (e.g., second redistribution layer 152) may be additionally formed on one surface of the semiconductor package 100A, such that electrical characteristics of a premium level of smartphone product may be improved, and at the same time, efficient space utilization may be realized.

Figure 11:
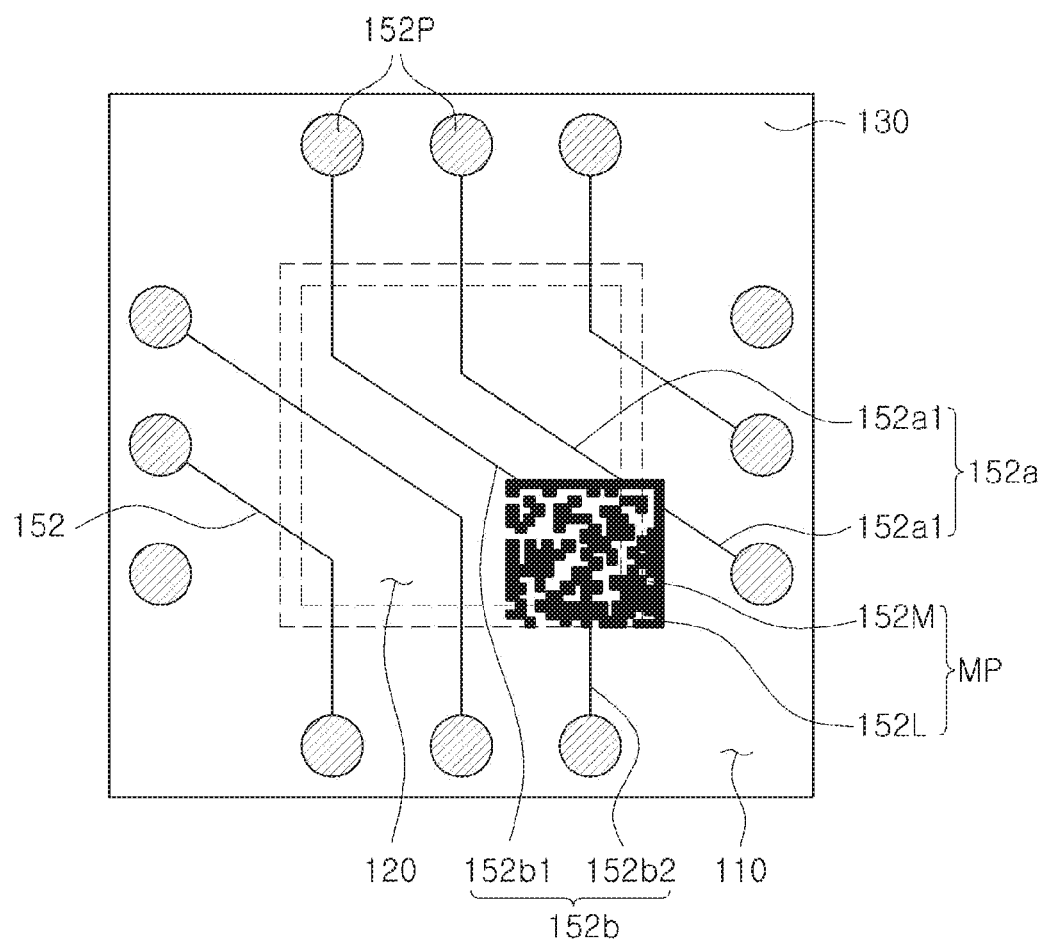
FIG. 11 is a top plan view illustrating a second redistribution layer and an identification mark in the semiconductor package of FIG. 9.

As illustrated in FIGS. 9 and 11, the semiconductor package 100A according to the exemplary embodiment may include the mark MP formed above the encapsulant 130 and indicating identification information. Here, the identification information may include various information having traceability of the corresponding semiconductor package, that is, a process number, a manufacturer, a manufacturing date, a product name, a kind of product, and a combination thereof. Further, the mark MP may include a two-dimensional barcode including a large amount of information in a narrow area, in addition to a sign, a number, and a character. For example, various kinds of two-dimensional barcodes such as a data matrix, a quick response (QR) code, and the like may be implemented.

In the exemplary embodiment, since the insulating layer 132 is formed on the encapsulant 130, the mark MP may be formed on the insulating layer 132 together with the second redistribution layer 152. The insulating layer 132 may be disposed on a surface of the encapsulant 130 damaged during a process, and may thus provide a suitable surface state for forming the second redistribution layer 152 (see FIGS. 14B and 14C).

The mark MP may include a plurality of metal patterns 152M formed to indicate identification information and circuit lines 152L connected to the second redistribution layer 152. The mark MP may include the same metal as that of the second redistribution layer 152. In detail, the mark MP may be formed together with the second redistribution layer 152 by the same process (see FIGS. 14F and 14G).

The metal patterns 152M may be used as elements for identification which is an essential function of the mark MP, whereas the circuit lines 152L may be used as non-identification elements, that is, elements which are not included as the identification information. Although the circuit lines 152L may be disposed in a mark forming region, the circuit lines 152L may be part of the backside circuit as an element of the second redistribution layer 152 in terms of function. The mark MP adopted in the exemplary embodiment will be described in detail with reference to FIGS. 11 and 12.

Figure 12:
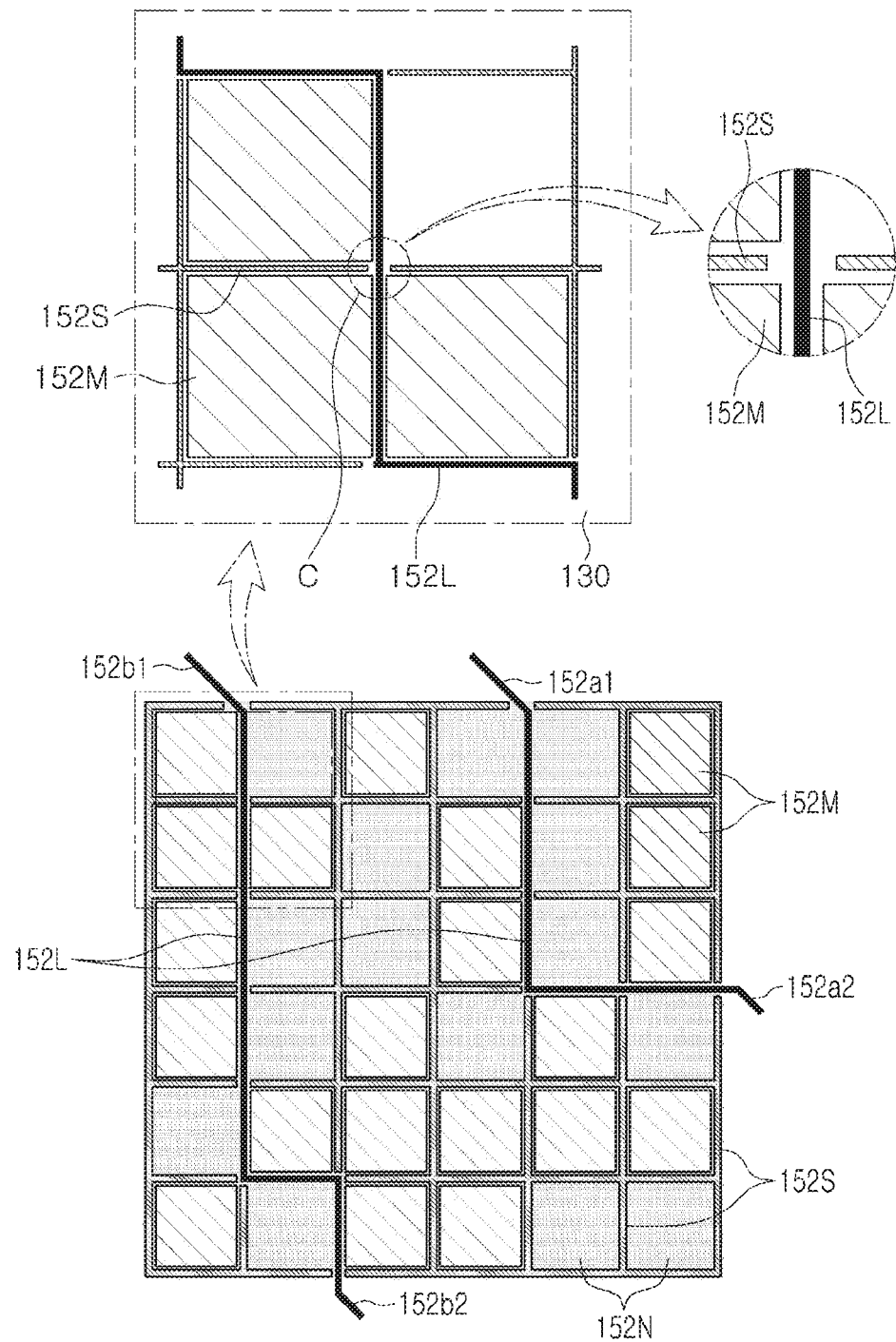
FIG. 12 is a plan view illustrating an example (two-dimensional barcode pattern) of an identification mark that may be adopted in the exemplary embodiment.

FIG. 11 is a top plan view illustrating the second redistribution layer 152 and the mark MP in the fan-out semiconductor package 100A of FIG. 9, and FIG. 12 is a plan view illustrating a two-dimensional barcode mark as an example of the mark MP that may be adopted in the exemplary embodiment.

Referring to FIGS. 11 and 12, the mark MP adopted in the exemplary embodiment may include metal patterns 152M provided in a form of a plurality of pixels to form a two-dimensional barcode and metal lines 152S disposed around the plurality of pixels. As illustrated in FIG. 12, the metal lines 152S may form a lattice surrounding the plurality of pixels together with the circuit lines 152L. Non-metal patterns 152N (for example, respective regions in which the dry film DF remains in FIG. 15B and which are filled with the second passivation layer 190 in FIG. 15D after removing the dry film DF in FIG. 15C) may be dispersed among the metal patterns 152M. The plurality of pixels may include the metal patterns 152M and the non-metal patterns 152N arranged in an array. The metal lines 152S and the circuit lines 152L may be disposed between adjacent pixels. The metal patterns 152M, dispersed among the pixels and spaced apart from the circuit lines 152L and the metal lines 152S, may be electrically isolated from the second redistribution layer 152, the circuit lines 152L, and the metal lines 152S. The metal lines 152S, similar to the metal patterns 152M, may also be electrically isolated from the second redistribution layer 152 and the circuit lines 152L. The metal patterns 152M and the metal lines 152S may be electrically floating in the semiconductor package 100A. Although not shown, the metal lines 152S may be omitted. On the other hand, the circuit lines 152L may cross a region forming the plurality of pixels (including the metal patterns 152M and the non-metal patterns 152N) and be electrically connected to the second redistribution layer 152 through a wiring line 152b.

The wiring line 152a of the second redistribution layer 152 is divided into two lines of 152a1 and 152a2, and a wiring line 152b of the second redistribution layer 152 is divided into two lines of 152b1 and 152b2 based on the mark MP disposed therebetween. However, the wiring lines 152a and 152b may be connected through the circuit lines 152L of the mark MP which is a two-dimensional barcode, thereby implementing a circuit with a relatively short path. As described above, when the mark MP is formed on a level (that is, an upper surface of the insulating layer 132) on which the second redistribution layer 152 is disposed, great limitations on a circuit design for the second redistribution layer 152 are inevitable. However, such limitations may be alleviated and a degree of design freedom may be increased by forming the mark MP with the metal patterns 152M having identification elements, and the circuit lines 152L which are non-identification elements constituting a second redistribution layer circuit. Further, even when the circuit lines 152L are formed to pass among the plurality of metal patterns 152M forming the mark MP, a line width of the circuit line 152L may be smaller than a width of each of the metal patterns 152M which are recognition targets, such that the circuit lines 152L may not act as noise in a process of reading identification information. For example, the line width of the circuit line 152L may be designed to be 10% or less of the width of each of the metal patterns 152M used as identification elements.

As shown in "C" of FIG. 12, the metal lines 152S may be physically separated from the circuit lines 152L. Since a desired path of the circuit line 152L needs to be accurately set, the circuit lines 152L may be arranged separately from the metal lines 152S which do not constitute the circuit, but the circuit lines 152L are not limited thereto.

As described above, when forming the mark MP in the two-dimensional barcode form, the mark MP may include the metal patterns 152M which are a plurality of pixels arranged to form a two-dimensional barcode, and a plurality of line patterns (the circuit lines 152L and the metal lines 152S) forming a lattice surrounding each of the metal patterns 125M which are a plurality of pixels.

At least one of the plurality of line patterns may be connected to the second redistribution layer 152 to be provided as a circuit line 152L acting as part of the second redistribution layer 152. As a result, a desirable degree of circuit design freedom may be maintained even though the mark MP is introduced on the same layer (that is, on the insulating layer 132) as that of the second redistribution layer 152.

In an identification process using the mark MP which is a two-dimensional barcode adopted in the exemplary embodiment, desired identification information may be obtained by performing irradiation of light on the mark MP and conversion into a digital signal based on a difference in amount of reflected light. It goes without saying that the identification information may be confirmed with the naked eye when the mark MP is a sign, and the like.

The mark MP that may be adopted in the exemplary embodiment is not limited to a two-dimensional barcode, but may include a sign, a number, a character, and a combination thereof.

Figure 13:
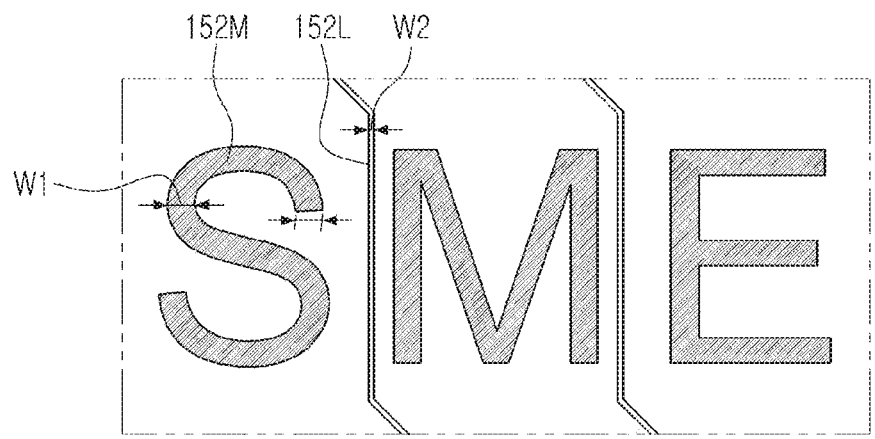
FIG. 13 is a plan view illustrating another example (character or sign) of an identification mark that may be adopted in the exemplary embodiment.

Referring to FIG. 13, an example of the mark MP may include metal patterns 152M represented by alphabetic characters to indicate identification information (e.g., manufacturer) and circuit lines 152L passing between the alphabetic characters. The circuit lines 152L may be connected to the second redistribution layer 152 to act as part of the second redistribution layer 152, and may be used as non-identification elements so as not to act as noise in the process of reading the mark. For example, a line width W2 of the circuit line 152L may be designed to be 10% or less of a width W1 of each of the metal patterns 152M used as identification elements. The metal lines 152S used in the two-dimensional barcode mark shown in FIGS. 11 and 12 may be omitted here.

The respective components included in the semiconductor package 100A according to the exemplary embodiment will hereinafter be described in more detail.

The frame 110 may improve rigidity of the semiconductor package 100A depending on certain materials of insulating layers 111a and 111b, and serve to secure uniformity in thickness of the encapsulant 130. The frame 110 may have the cavity 110H penetrating through the insulating layers 111a and 111b. The semiconductor chip 120 is disposed in the cavity 110H, and a passive component (not illustrated) may also be disposed together with the semiconductor chip 120 in some exemplary embodiments. The cavity 110H may have a form in which a wall of the cavity 110H surrounds the semiconductor chip 120, but is not necessarily limited thereto. The frame 110 may include the wiring layers 112a, 112b, and 112c, and the wiring vias 113a and 113b in addition to the insulating layers 111a and 111b. In this case, the wiring layers 112a, 112b, and 112c and the wiring vias 113a and 113b may function as vertical connection members in a package structure. In some exemplary embodiments, a vertical connection member such as a metal post may be included as another form that may replace the frame 110 (see FIG. 19).

The frame 110 may include a first insulating layer 111a in contact with the connection member 140, a first wiring layer 112a in contact with the connection member 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the other surface of the first insulating layer 111a opposing one surface of the first insulating layer 111a in which the first wiring layer 112a is embedded and covering at least a portion of the second wiring layer 112b, and a third wiring layer 112c disposed on the other surface of the second insulating layer 111b opposing one surface of the second insulating layer 111b in which the second wiring layer 112b is embedded. The first and second wiring layers 112a and 112b and the second and third wiring layers 112b and 112c may be electrically connected to each other through first and second wiring vias 113a and 113b penetrating through the first and second insulating layers 111a and 111b, respectively. The first to third wiring layers 112a, 112b, and 112c may be electrically connected to the connection pads 122 through the first redistribution layers 142 of the connection member 140. Although the wiring structure of the frame adopted in the exemplary embodiment is exemplified as a form including three wiring layers 112a, 112b, and 112c, and wiring vias 113a and 113b connecting the wiring layers 112a, 112b, and 112c to one another, the number of layers may be different and the wiring structure may also be implemented as various other structures (See FIG. 18).

A material of each of the insulating layers 111a and 111b is not particularly limited. For example, an insulating material may be used as the material of each of the insulating layers 111a and 111b. In this case, a thermosetting resin such as an epoxy resin, a thermoplastic resin such as a polyimide resin, a resin in which the thermosetting resin or the thermoplastic resin is mixed with an inorganic filler, for example, Ajinomoto Build-up Film (ABF), or the like, may be used as the insulating material. Alternatively, a material in which a thermosetting resin or a thermoplastic resin is impregnated together with an inorganic filler in a core material such as a glass fiber (or a glass cloth or a glass fabric), for example, prepreg, or the like, may also be used as the insulating material. In some exemplary embodiments, a PID resin may also be used as the material of each of the insulating layers 111a and 111b.

As described above, the wiring structure including the wiring layers 112a, 112b, and 112c, and the wiring vias 113a and 113b may provide a vertical connection path of the semiconductor package 100A, and may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection member pads, and the like. The wiring layers 112a, 112b, and 112c may be formed by a known plating method, and each of the wiring layers 112a, 112b, and 112c may be a seed layer and a conductive layer. A thickness of each of the wiring layers 112a, 112b, and 112c may be greater than that of each of the first redistribution layers 142.

As illustrated in FIG. 9, the first wiring layer 112a may be recessed into the first insulating layer 111a. As described above, when the first wiring layer 112a is recessed into the first insulating layer 111a, such that a lower surface of the first insulating layer 111a and a lower surface of the first wiring layer 112a have a step therebetween, a phenomenon in which a material of the encapsulant 130 bleeds to pollute the first wiring layer 112a may be prevented.

The wiring vias 113a and 113b may electrically connect the wiring layers 112a, 112b, and 112c formed on different layers to each other, resulting in an electrical path in the frame 110. A material of each of the wiring vias 113a and 113b may be a conductive material such as copper (Cu), aluminum (Al), silver (Ag), tin (Sn), gold (Au), nickel (Ni), lead (Pb), titanium (Ti), or alloys thereof. Each of the wiring vias 113a and 113b may be a filled via completely filled with a conductive material, or a conformal via in which a conductive material is formed along a wall of each of via holes. In addition, each of the wiring vias 113a and 113b may have a tapered shape. The wiring vias 113a and 113b may be formed by a plating method, and each of the wiring vias 113a and 113b may be a seed layer and a conductive layer.

When a hole for a first wiring via 113a is formed, some of the pads of the first wiring layer 112a may serve as a stopper. Therefore, it may be advantageous in a process that the first wiring via 113a has the tapered shape of which a width of an upper surface is greater than that of a lower surface. In this case, the first wiring via 113a may be integrated with a pad pattern of the second wiring layer 112b. Further, when a hole for the second wiring via 113b is formed, some of the pads of the second wiring layer 112b may serve as a stopper. Therefore, it may be advantageous in a process that the second wiring via 113a has the tapered shape of which a width of an upper surface is greater than that of a lower surface, similarly to the first wiring via 113a. In this case, the second wiring via 113b may be integrated with a pad pattern of the third wiring layer 112c. Meanwhile, although not illustrated, in some exemplary embodiments, a metal layer (not illustrated) may be disposed on a wall of the cavity 110H of the frame 110 and surround the semiconductor chip 120 for the purpose of shielding an electromagnetic wave or dissipating heat.

The semiconductor chip 120 may be an integrated circuit (IC) in which an amount of several hundred to several million or more elements are integrated in a single chip. In this case, the IC may be, for example, an application processor chip such as a central processor (for example, a CPU), a graphic processor (for example, a GPU), a digital signal processor, a cryptographic processor, a micro processor, a micro controller, or the like, but is not limited thereto. The IC may be a power management IC (PMIC), a memory chip such as a volatile memory (for example, a DRAM), a non-volatile memory (for example, a ROM), a flash memory, or the like, or a logic chip such as an analog-to-digital converter, an application-specific IC (ASIC), or the like.

The semiconductor chip 120 may be an IC in a bare state in which a separate bump or redistribution layer is not formed. However, the semiconductor chip 120 is not limited thereto, but may be a packaged IC, if necessary. The IC may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 122 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide film and a nitride film. An insulating layer (not illustrated), and the like, may also be further disposed in other required positions. Meanwhile, a surface of the semiconductor chip 120 on which the connection pads 122 are disposed may be an active surface, and a surface of the semiconductor chip 120 opposing the active surface may be an inactive surface. In this case, when the passivation layer 123 is formed on the active surface of the semiconductor chip 120, a positional relationship of the active surface of the semiconductor chip 120 is determined based on a lowermost surface of the passivation layer 123.

The encapsulant 130 may encapsulate the frame 110 and the semiconductor chip 120, and may fill at least a portion of the cavity 110H. The material of the encapsulant 130 may be an insulating material, and the insulating material may be a material including an inorganic filler and an insulating resin, for example, a thermosetting resin such as an epoxy resin, a thermoplastic resin such as a polyimide resin, or a resin having a reinforcing material such as an inorganic filler, such as ABF, FR-4, Bismaleimide Triazine (BT), or the like. In addition, a molding material such as an epoxy molding compound (EMC) may be used, and a photosensitive material, that is, a photoimagable encapsulant (PIE) resin may be used. In some exemplary embodiments, a material in which an insulating resin such as a thermosetting resin or a thermoplastic resin is impregnated in an inorganic filler and/or a core material such as a glass fiber (or a glass cloth or a glass fabric) may also be used as the insulating material. The insulating layer 132 disposed on an upper surface of the encapsulant 130 may be formed of a material that is the same as or similar to that of the encapsulant 130.

The second redistribution layer 152 may be disposed on the insulating layer 132. In some exemplary embodiment, the insulating layer is not formed, and in this case (e.g., FIG. 14A through 14H), the second redistribution layer 152 may be formed on a surface of the encapsulant 130. The second redistribution layer 152 may also include a conductive material such as copper (Cu), aluminum (Al), silver (Ag), tin (Sn), gold (Au), nickel (Ni), lead (Pb), titanium (Ti), or alloys thereof, similarly to the first redistribution layers 142 and the wiring layers 112a, 112b, and 112c. The second redistribution layer 152 may perform various functions depending on a design. For example, the second redistribution layer 152 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layer 152 may include via pads, wire pads, electrical connection member pads, and the like. The second redistribution layer 152 may be formed by a known plating method, and may be a seed layer and a conductive layer.

The second redistribution (RDL) via 153 may electrically connect the second redistribution layer 152 and the third wiring layer 112c of the wiring structure to each other through the opening 130h. The second redistribution via 153 may also include a conductive material such as copper (Cu), aluminum (Al), silver (Ag), tin (Sn), gold (Au), nickel (Ni), lead (Pb), titanium (Ti), or alloys thereof, similarly to the second redistribution layer. The second redistribution via 153 may be a filled via completely filled with a conductive material, or a conformal via in which a conductive material is formed along a wall of a via hole. In addition, the second redistribution via 153 may have a tapered shape. The second redistribution via 153 may be formed by a plating method, and may be a seed layer and a conductive layer.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection metals 180 depending on the functions. In FIG. 9, the connection member 140 has a form in which two insulating layers 141, two first redistribution layers 142, and two first redistribution vias 143 as described above. However, in other exemplary embodiments, the connection member 140 may be formed to have a single layer structure or a multilayer structure of which the number of layers is larger than that illustrated in FIG. 9.

A material of each of the insulating layers 141 may be an insulating material. Here, a PID material may be used as the insulating material, and in this case, a fine pitch may be achieved through a photo via, such that significantly effective redistribution of several tens to several hundreds of connection pads 122 of the semiconductor chip 120 may be made.

The first redistribution layers 142 may redistribute the connection pads 122 of the semiconductor chip 120 to electrically connect the connection pads 122 and the electrical connection metals 180 to each other. A material of each of the first redistribution layers 142 may also be a conductive material such as copper (Cu), aluminum (Al), silver (Ag), tin (Sn), gold (Au), nickel (Ni), lead (Pb), titanium (Ti), or alloys thereof. The first redistribution layers 142 may also perform various functions depending on a design. For example, the first redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layers 142 may include via pads, electrical connection member pads, and the like.

The first redistribution via 143 may electrically connect the first redistribution layers 142 formed on different layers to each other, and particularly, may be used to electrically connect the connection pads 122 of the semiconductor chip 120 and the first redistribution layers 142 to each other. The first redistribution via 143 may be in physical contact with the connection pads 122 when the semiconductor chip 120 is a bare die. A material of the first redistribution via 143 may also be a conductive material such as copper (Cu), aluminum (Al), silver (Ag), tin (Sn), gold (Au), nickel (Ni), lead (Pb), titanium (Ti), or alloys thereof. The first redistribution via 143 may be completely filled with the conductive material, or the conductive material may also be formed along a wall of each of via holes. In addition, the first redistribution via 143 may have a tapered shape, or the like.

Each of the first and second passivation layers 160 and 190 may be provided as a layer for protecting the semiconductor package from external physical or chemical damage. In detail, the first passivation layer 160 disposed at a lower portion of the semiconductor package may be provided to protect the connection member 140, and the second passivation layer 190 disposed at an upper portion of the semiconductor package may be provided to protect the second redistribution layer 152. At least the second passivation layer 190 may be formed of a transparent resin in order to secure visibility of the mark MP. Similarly to the second passivation layer 190, the first passivation layer 160 may have the openings 160h exposing at least portions of the lowermost first redistribution layer 142. The first passivation layer 160 may include an insulating resin and an inorganic filler, but may not include a glass fiber. For example, the first and second passivation layers 160 and 190 may be formed of ABF, but is not limited thereto. The first and second passivation layers 160 and 190 may also be formed of a PID material.

The underbump metal layers 170 may be used to improve connection reliability of the electrical connection metals 180. That is, the underbump metal layers 170 may improve board level reliability of the semiconductor package 100A according to the exemplary embodiment. The semiconductor package 100A may include several tens to several tens of thousand of underbump metal layers 170. The underbump metal layers 170 may be connected to the first redistribution layer 142, respectively, through the openings 160h penetrating through the first passivation layer 160. The underbump metal layers 170 may be formed by any known metallization method using a metal, but is not limited thereto.

The electrical connection metals 180 may be configured to physically or electrically externally connect the semiconductor package 100A. For example, the semiconductor package 100A may be mounted on a main board of an electronic device through the electrical connection metals 180. The electrical connection metals 180 may be formed of a low melting point metal, for example, tin (Sn) or an alloy including tin (Sn). In more detail, each of the electrical connection metals 180 may be formed of a solder, or the like. However, this is only an example, and a material of each of the electrical connection metals 180 is not particularly limited thereto. Each of the electrical connection metals 180 may be a land, a ball, a pin, or the like. The electrical connection metals 180 may be formed to have a multilayer or single layer structure. When each of the electrical connection metals 170 is formed to have a multilayer structure, the electrical connection structures 170 may include a copper (Cu) pillar and a solder. When each of the electrical connection metals 170 is formed to have a single layer structure, the electrical connection metals 170 may include a tin-silver solder or copper (Cu). However, this is only an example, and the electrical connection metals 170 are not limited thereto. The number, an interval, a disposition form, and the like, of electrical connection metals 180 are not particularly limited, but may be sufficiently modified depending on design particulars by those skilled in the art. For example, the electrical connection metals 180 may be provided in an amount of several tens to several thousands according to the number of connection pads 122, or may be provided in an amount of several tens to several thousands or more or several tens to several thousands or less.

At least one of the electrical connection metals 180 may be disposed in a fan-out region. The fan-out region refers to a region except for a region in which the semiconductor chip 120 is disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the fan-out package may be manufactured to have a small thickness, and may have price competitiveness.

FIGS. 14A through 14H are cross-sectional views for describing main processes of a method of manufacturing a semiconductor package according to an exemplary embodiment in the present disclosure.

Figure 14A:
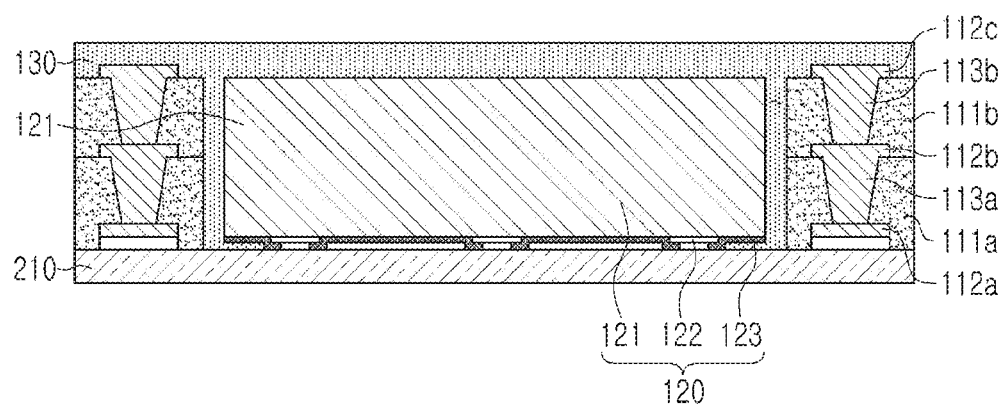
FIGS. 14A through 14H are cross-sectional views for describing main processes of a method of manufacturing a semiconductor package according to an exemplary embodiment in the present disclosure.

Referring to FIG. 14A, a semiconductor chip 120 and a frame 110 having a cavity 110H in which the semiconductor chip 120 is accommodated may be disposed on a first adhesive film 210, and an encapsulant 130 encapsulating the semiconductor chip 120 may be formed.

As described above, the frame 110 adopted in the exemplary embodiment may have a wiring structure together with first and second insulating layers 111a and 111b, and the wiring structure may include three wiring layers 112a, 112b, and 112c, and wiring vias 113a and 113b connecting the wiring layers 112a, 112b, and 112c to one another. The first adhesive film 210 may be attached to a lower side of the first insulating layer 111a. For example, the first adhesive film 210 may be a tape including an epoxy resin, or the like. The semiconductor chip 120 may be mounted in the cavity 110H of the frame 110, and the encapsulant 130 encapsulating the semiconductor chip 120 may be formed by using a suitable encapsulation material. The encapsulant 130 may extend to an upper surface of the frame 110 to cover a third wiring layer 112c.

Figure 14B:
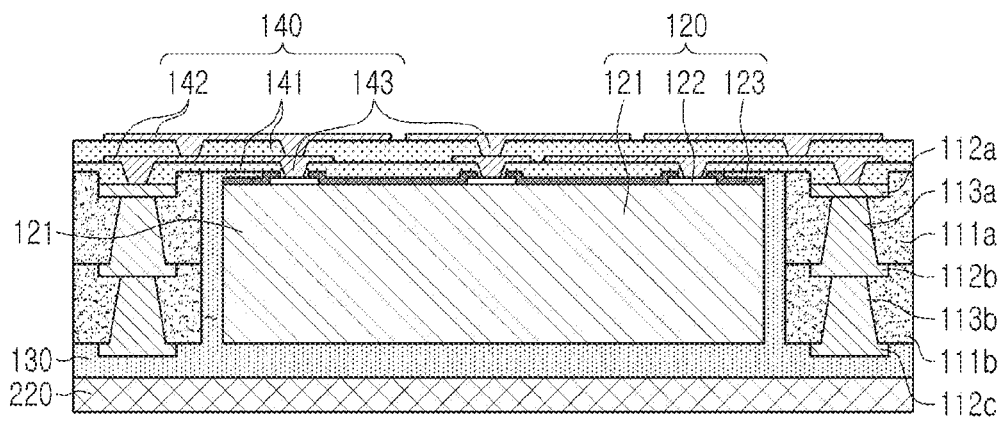

Then, referring to FIG. 14B, a second adhesive film 220 may be attached to an upper surface of the encapsulant 130, the first adhesive film 210 may be removed, and then a connection member may be formed on a surface from which the first adhesive film 210 is removed.

The connection member 140 may be formed by forming an insulating layer 141 by a lamination method, an applying method, or the like, and forming via holes in the insulating layer 141, and forming first redistribution layers 142 and first redistribution vias 143 by electroplating or electroless plating. When a PID material is used for the insulating layer, the via holes with a fine pitch may be formed by using a photolithography method.

Figure 14C:
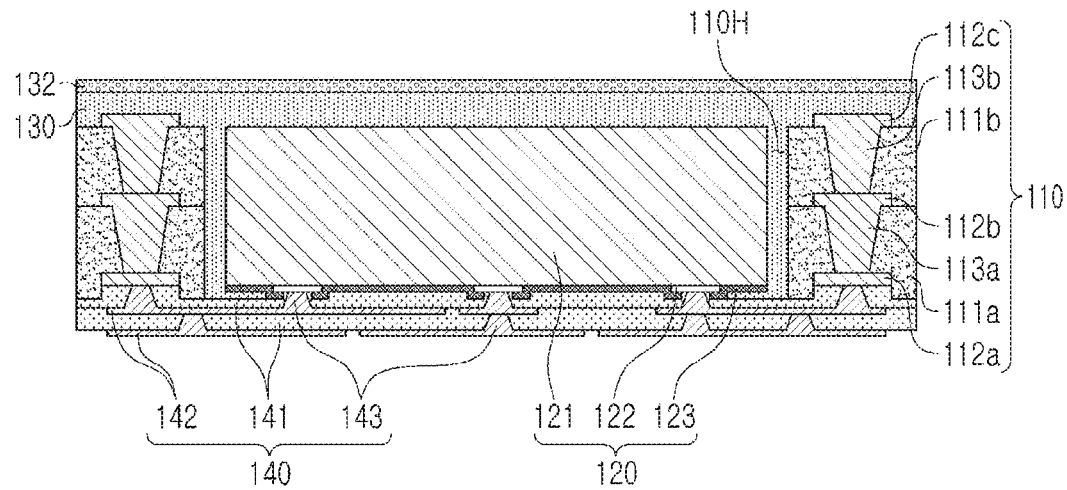

Next, as illustrated in FIG. 14C, the second adhesive film 220 may be removed, and an insulating layer 132 may be formed on a surface of the encapsulant 130 from which the second adhesive film 220 is removed.

As described above, the encapsulant 130 may have a surface state in which a fine circuit such as a second redistribution layer 152 is difficult to be implemented during a process of forming the connection member 140 after encapsulating the semiconductor chip 120 and a process of removing the second adhesive film 220. In order to solve such a problem, the insulating layer 132 may be additionally formed on the surface of the encapsulant 130, and the second redistribution layer (152 in FIG. 14G) may be smoothly formed on an upper surface of the insulating layer 132. The insulating layer 132 may be formed of a material that is the same as or similar to that of the encapsulant 130.

Figure 14D:
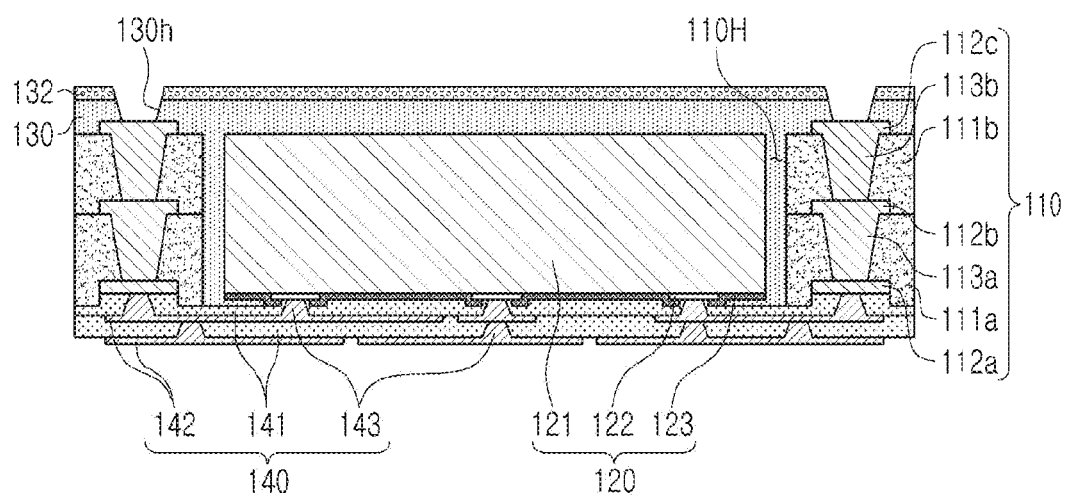

Then, referring to FIG. 14D, an opening 130h exposing at a least portion of the third wiring layer 112c of the frame 110 may be formed in the encapsulant 130 and the insulating layer 132.

A processing method for the opening 130h may be selected depending on a material of the encapsulant 130 and the insulating layer 132, and for example, when the encapsulant 130 is formed of a non-photosensitive insulating material such as ABF, the opening 130h may be formed by laser processing while using the third wiring layer 112c as a stopper layer. After the opening 130h is formed, clearing may be performed depending on the material of the encapsulant 130. For example, when the encapsulant 130 is a non-photosensitive insulating material such as ABF, the clearing may be performed by desmearing.

Next, a process of forming the second redistribution layer 152 and a mark MP disposed on the insulating layer 132 may be performed.

Figure 14E:
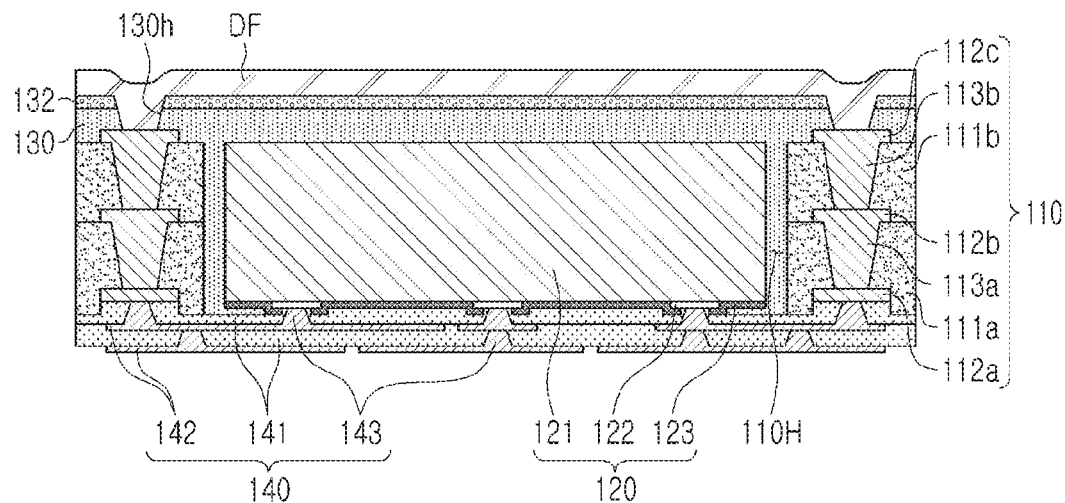
Figure 14F:
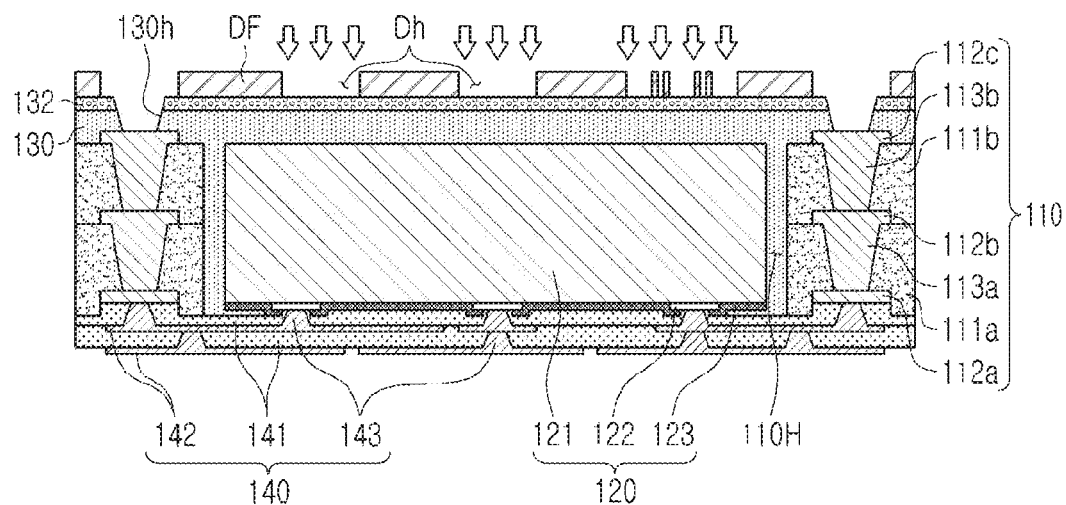

As illustrated in FIG. 14E, a dry film (DF) may be formed on the insulating layer 132, and as illustrated in FIG. 14F, regions Dh of the dry film DF in which the second redistribution layers 152 and the mark MP are to be formed may be selectively removed by using a photolithography method.

As the process described above, processes illustrated in FIGS. 15A and 15B may be performed. FIGS. 15A through 15D are plan views for describing main processes of forming an identification mark according to an exemplary embodiment in the present disclosure, and a plane illustrated in FIGS. 15A through 15D may be understood as a plane corresponding to the expanded portion of FIG. 12.

Figure 15A:
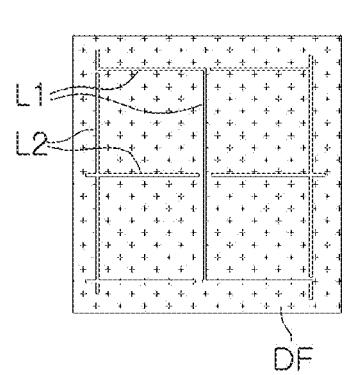
FIGS. 15A through 15D are plan views for describing main processes of forming an identification mark according to an exemplary embodiment in the present disclosure.

First, as illustrated in FIG. 15A, first and second openings L1 and L2 for line patterns forming a lattice may be formed in the dry film DF. The first opening L1 may be an opening for a circuit line, and the second opening L2 may be an opening for a metal line.

Figure 15B:
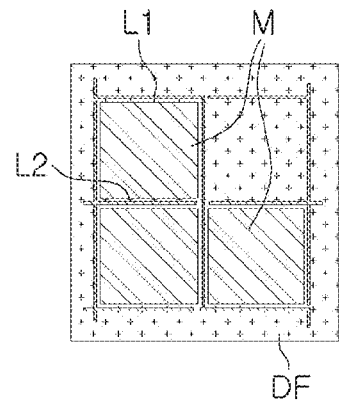

Then, as illustrated in FIG. 15B, a third opening M corresponding to a pixel forming a two-dimensional barcode may be formed. The third opening M may be provided as an opening for a metal pattern. Each of the first and second openings L1 and L2 is formed to have a small line width, whereas the third opening M forming a two-dimensional barcode has a relatively large area, such that an exposure process for the third opening M may be performed by using laser direct imaging (LDI).

Figure 14G:
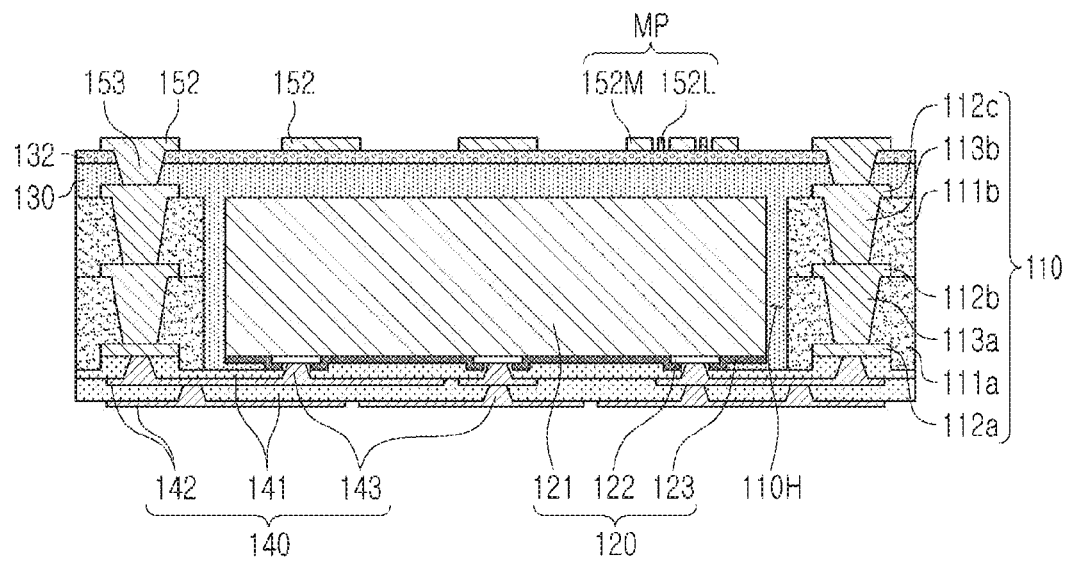
Figure 15C:
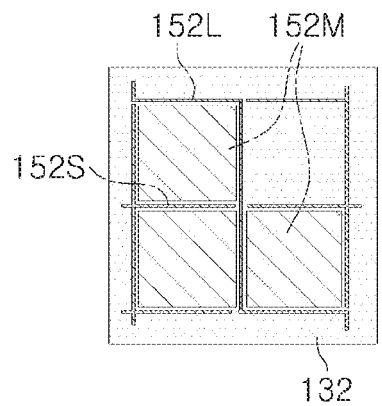

Then, referring to FIGS. 14G and 15C, the second redistribution layer 152 and the mark MP may be obtained by performing plating using the patterned dry film DF and then removing the dry film DF.

The second redistribution layer 152 and the mark MP may be formed of the same metal through the process described above. The mark MP may include a plurality of metal patterns 152M and line patterns 152L and 152S forming a lattice to surround the plurality of metal patterns 152M, and at least one of the line patterns 152L and 152S may be a circuit line 152L connected to the second redistribution layer 152.

Figure 14H:
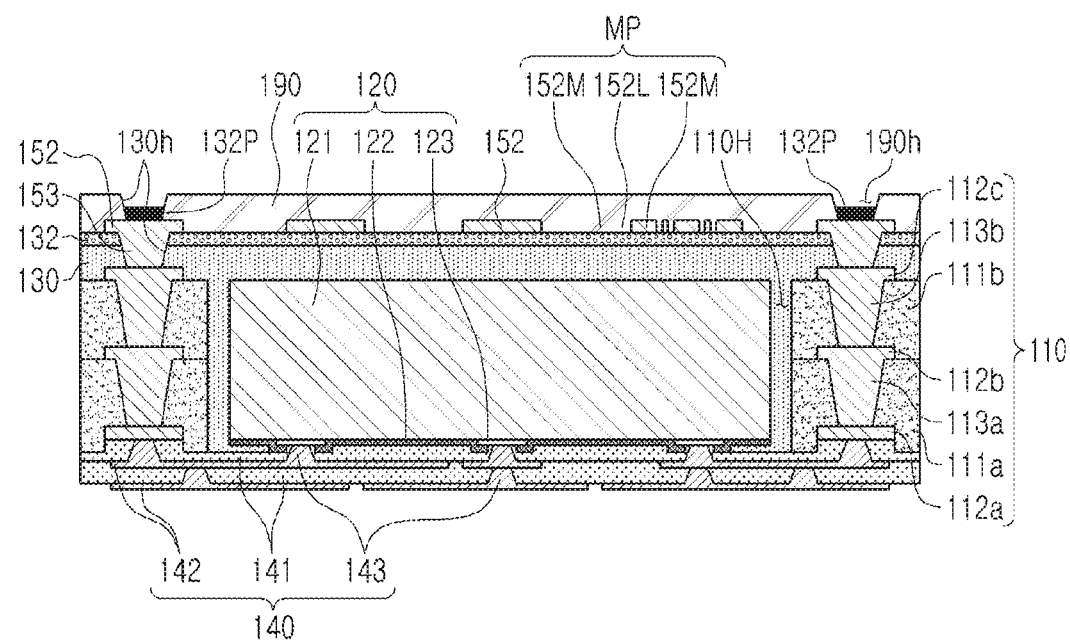
Figure 15D:
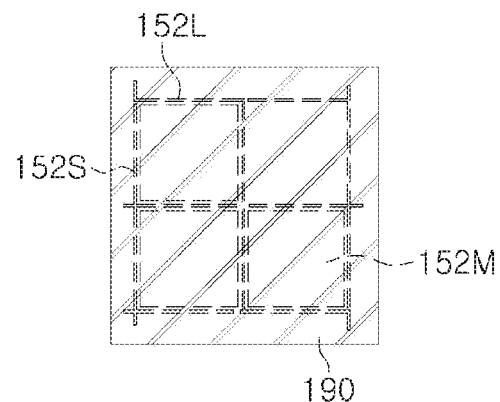

Then, referring to FIGS. 14H and 15D, a transparent passivation layer (also referred to as a second passivation layer) 190 may be formed on the insulating layer 132 to cover the second redistribution layer 152 and the mark MP.

The second redistribution layer 152 may be formed on the insulating layer 132 by plating, and in this process, a second redistribution via 153 may be formed in the opening 130h to thereby connect the second redistribution layer 152 and the third wiring layer 112c to each other. Further, the second passivation layer 190 may be formed to cover the second redistribution layer 152 and the mark MP disposed on the insulating layer 132. Although the mark MP is covered by the second passivation layer 190, the second passivation layer 190 may include a resin having transparency (e.g., PID resin), thereby securing visibility of the mark MP.

Then, a first passivation layer 160, underbump metal layers 170, and electrical connection metals 180 may be formed on the connection structure 140 by a known method, if necessary. Meanwhile, such a series of processes may be performed on a panel level, and in this case, a plurality of semiconductor packages 100A may be manufactured by performing a manufacturing process once, if a dicing process is modified.

Figure 16:
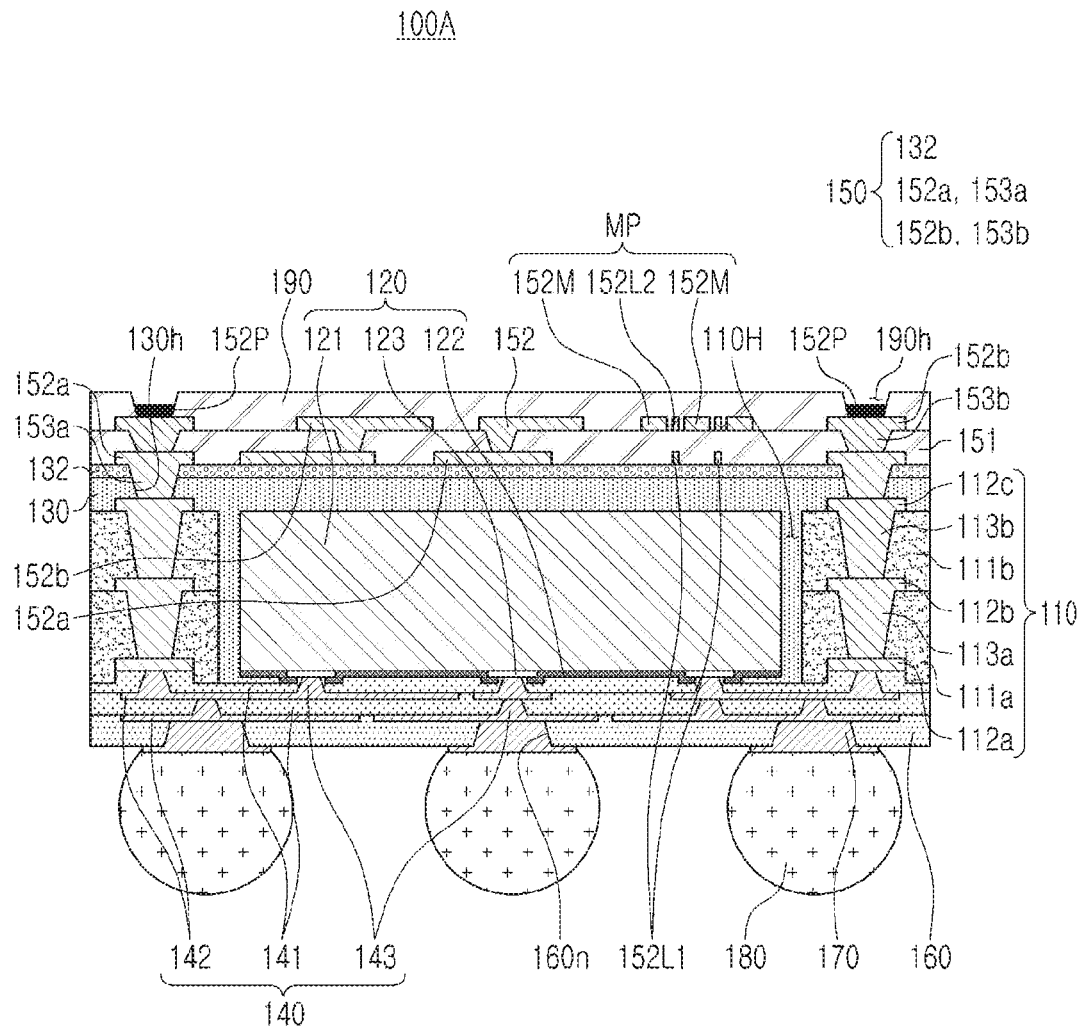
FIG. 16 is a schematic cross-sectional view illustrating a semiconductor package according to an exemplary embodiment in the present disclosure.

FIG. 16 is a schematic cross-sectional view illustrating a semiconductor package according to an exemplary embodiment in the present disclosure.

Referring to FIG. 16, it may be understood that a semiconductor package 100A according to the exemplary embodiment has a structure similar to that illustrated in FIGS. 9 through 13 except that the semiconductor package 100A includes a second connection member 150 having second redistribution layers 152. Components according to the exemplary embodiment may be understood with reference to the description for the same or similar components of the semiconductor package 100A illustrated in FIGS. 9 through 13 unless explicitly described to the contrary.

The semiconductor package 100A according to the exemplary embodiment may include a second connection member 150 disposed at the other side opposing a side at which the first connection member 140 is disposed and including second redistribution layers 152a and 152b connected to the wiring structure, in addition to the first connection member 140 including the first redistribution layers 142. The second connection member 150 may include a first insulating layer 132 disposed on the encapsulant 130, a lower redistribution layer 152a disposed on the first insulating layer 132, a second insulating layer 151 disposed on the lower redistribution layer 152a, and an upper redistribution layer 152b disposed on the second insulating layer 151 to be connected to the lower redistribution layer 152a. The lower redistribution layer 152a may be connected to the wiring structure (particularly, the third redistribution layer 112c) through a redistribution via 153a, and the upper redistribution layer 152b may be connected to the lower redistribution layer 152a through a redistribution via 153b.

In such a second connection member 150, the mark MP may be disposed on the same level as that of at least one of the lower and upper redistribution layers 152a and 152b.

In the exemplary embodiment, the metal patterns 152M of the mark MP may be disposed on the second insulating layer 151 together with the upper redistribution layer 152b. In addition to the metal patterns 152M, upper line patterns 152L2 may be formed around the metal patterns 152M on the second insulating layer 151, and some of the upper line patterns 152L2 may also be connected to the upper redistribution layer 152b to be provided as circuit lines.

When the second insulating layer 151 is a transparent insulating layer formed of a PID resin or the like, visibility may be secured. Therefore, the metal patterns 152M of the mark MP may also be formed on the first insulating layer 132, unlike the exemplary embodiment. Meanwhile, when the mark MP is formed on the second insulating layer 151 as in the exemplary embodiment, there is a need to set limitations on formation of the patterns to prevent other noise from occurring in a region of the first insulating layer 132 overlapping with the mark MP during a process of reading the mark MP. For example, circuit lines connected to the lower redistribution layer 152a may be disposed to overlap with the upper line patterns 152L2 in the overlapped region of the first insulating layer 132, thereby suppressing occurrence of noise. Similarly to lower line patterns 152L1, some of the upper line patterns 152L2 may also be circuit lines connected to the upper redistribution layer 152b to be provided as part of a redistribution circuit. As described above, at least one of the lower line patterns 152L1 and the upper line patterns 152L2 may include a circuit line connected to the second redistribution layer 152a or 152b.

FIGS. 17A through 17G are plan views for describing main processes of forming an identification mark according to the exemplary embodiment, and illustrate an example in which some of the lower line patterns 152L1 are circuit lines.

First, as illustrated in FIG. 17A, first and second openings La and Lb for the lower line patterns forming a lattice are formed in a first dry film DF1. The first opening La may be an opening for a circuit line, and the second opening Lb may be an opening for a metal line.

Then, as illustrated in FIG. 17B, circuit lines 152L1 connected to the lower redistribution layer 152a and metal lines 152L0 spaced apart from the circuit lines 152L1 may be provided on the first insulating layer 132 by performing plating using the patterned first dry film DF1 and removing the first dry film DF1.

Then, as illustrated in FIG. 17C, the second insulating layer 151 may be formed on the first insulating layer 132 to cover the second redistribution layer 152 and the lower line patterns 152L1 and 152L0.

Next, as illustrated in FIG. 17D, openings Lc for the upper line patterns forming a lattice may be formed in a second dry film DF2. In the exemplary embodiment, since the upper line patterns do not include a circuit line, the openings Lc may be connected to each other to form a lattice shape.

Next, as illustrated in FIG. 17E, openings M for pixels forming a two-dimensional barcode may be additionally formed in the second dry film DF2. Such a process may be performed by using LDI.

Then, as illustrated in FIG. 17F, the mark MP including the metal patterns 152M and the line patterns 152L2 may be obtained by performing plating using the patterned second dry film DF1 and then removing the second dry film DF2.

Then, as illustrated in FIG. 17G, a transparent second passivation layer 190 may be formed on the second insulating layer 151 to cover the upper redistribution layer 152b and the mark MP.

Figure 18:
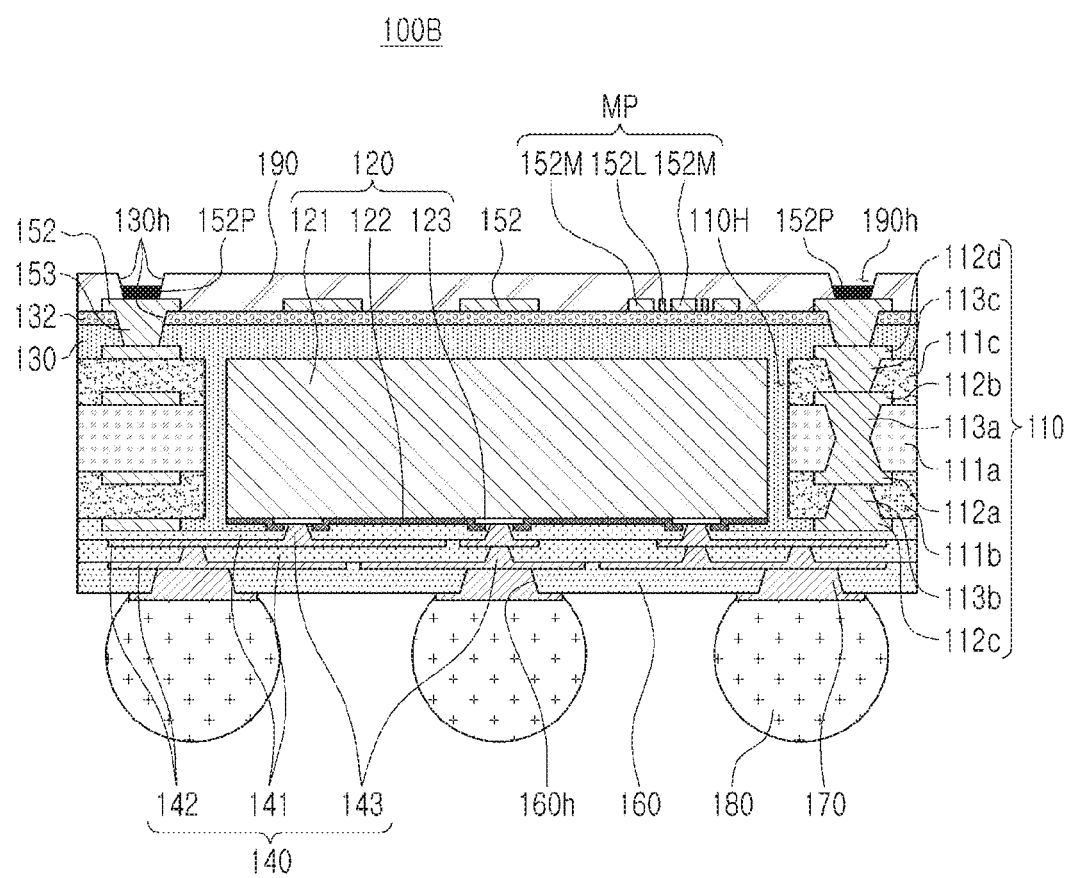
FIGS. 18 and 19 are schematic cross-sectional views illustrating semiconductor packages according to various exemplary embodiments in the present disclosure.

FIG. 18 is a schematic cross-sectional view illustrating a semiconductor package according to an exemplary embodiment in the present disclosure.

Referring to FIG. 18, it may be understood that a semiconductor package 100B according to the exemplary embodiment has a structure similar to that illustrated in FIGS. 9 through 13 except for a form of a wiring structure of a frame 110. Components according to the exemplary embodiment may be understood with reference to the description for the same or similar components of the semiconductor package 100A illustrated in FIGS. 9 through 13 unless explicitly described to the contrary.

The frame 110 adopted in the exemplary embodiment may have a different structure from that of the semiconductor package 100A, and thus the wiring structure of the frame 110 may also be changed accordingly. In detail, the frame 110 may include a first insulating layer 111a, a first wiring layer 112a disposed on one surface of the first insulating layer 111a, a second wiring layer 112b disposed on the other surface of the first insulating layer 111a, a second insulating layer 111b disposed on one surface of the first insulating layer 111a and covering at least a portion of the first wiring layer 112a, a third wiring layer 112c disposed on the other surface of the second insulating layer 111b opposing one surface of the second insulating layer 111b in which the first wiring layer 112a is embedded, a third insulating layer 111c disposed on the other surface of the first insulating layer 111a and covering at least a portion of the second wiring layer 112b, a fourth wiring layer 112d disposed on the other surface of the third insulating layer 111c opposing one surface of the third insulating layer 111c in which the second wiring layer 112b is embedded, a first wiring via 113a penetrating through the first insulating layer 111a and electrically connecting the first wiring layer 112a and the second wiring layer 112b to each other, a second via 113b penetrating through the second insulating layer 111b and electrically connecting the first wiring layer 112a and the third wiring layer 112c to each other, and a third wiring via 113c penetrating through the third insulating layer 111c and electrically connecting the second wiring layer 112b and the fourth wiring layer 112d to each other. The frame 110 adopted in the exemplary embodiment has a larger number of wiring layers 112a, 112b, 112c, and 112d, such that the first redistribution layer 142 of the connection member 140 may be further simplified.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112a and 112b. The first insulating layer 111a may include an insulating material different from those of the second insulating layer 111b and the third insulating layer 111c. For example, the first insulating layer 111a may be, for example, prepreg including a core material such as a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first wiring via 113a penetrating through the first insulating layer 111a may have a diameter greater than those of second wiring via 113b and third wiring via 113c each penetrating through the second insulating layer 111b and the third insulating layer 111c. The first wiring via 113a may have an hourglass shape or a cylindrical shape, and the second and third wiring vias 113b and 113c may have tapered shapes of which directions are opposite to each other. A thickness of each of the first to fourth wiring layers 112a, 112b, 112c, and 112d may be greater than that of the first redistribution layer 142.

Figure 19:
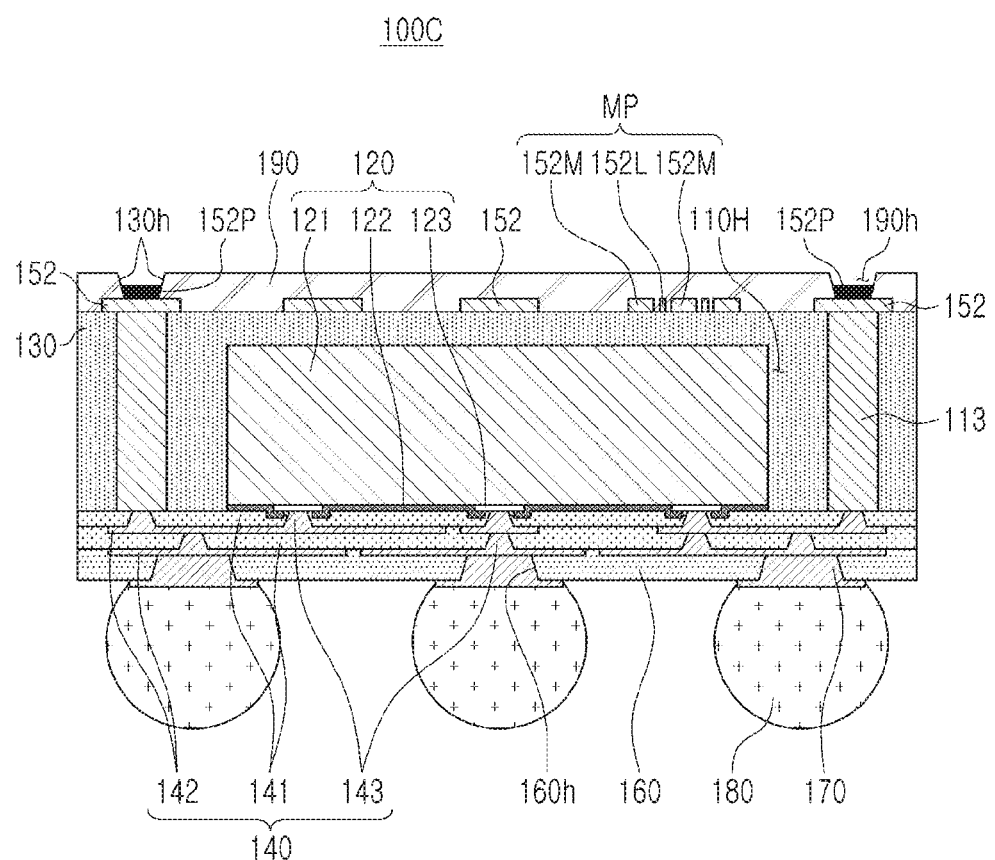

FIG. 19 is a schematic cross-sectional view illustrating a semiconductor package according to an exemplary embodiment in the present disclosure.

Referring to FIG. 19, it may be understood that a semiconductor package 100C according to the exemplary embodiment has a structure similar to that illustrated in FIGS. 9 through 13 except that the semiconductor package 100C does not include a frame and a form of a wiring structure 113 and a position at which a mark MP is formed are thus different from those of the semiconductor package 100A. Components according to the exemplary embodiment may be understood with reference to the description for the same or similar components of the semiconductor package 100A illustrated in FIGS. 9 through 13 unless explicitly described to the contrary.

The semiconductor package 100C according to the exemplary embodiment may not adopt a frame including a wiring structure. That is, the wiring structure 113 adopted in the exemplary embodiment may be connected to the first redistribution layer 142 of the connection member 140 without a frame structure, and extend in a thickness direction of the encapsulant 130. For example, the wiring structure 113 may be a metal post. Further, the encapsulant 130 may not include an insulating layer, and may include only an encapsulation region in which the semiconductor chip 120 is encapsulated. The second redistribution layer 152 may be formed on a surface of the encapsulant 130 and connected to the wiring structure 113. The mark MP adopted in the exemplary embodiment may be directly formed on the surface of the encapsulant 130, rather than on a separate insulting layer, together with the second redistribution layer 152. The second passivation layer 190 may include a transparent resin as described above. The encapsulant 130 may include a non-transparent resin, that is, an opaque resin or a translucent resin.

As set forth above, according to the exemplary embodiment in the present disclosure, there is provided a method capable of securing a sufficient degree of design freedom of the backside redistribution layer by providing the mark including metal patterns on the same level of layer as that of the backside redistribution layer and providing the circuit line having a small width and passing through the mark forming region as part of the redistribution layer which is a non-identification element.

Various useful advantages and effects according to the present disclosure are not limited to the contents described above, and may be more easily understood by the description of specific exemplary embodiments in the present disclosure.

While exemplary embodiments have been shown and described above, it will be apparent to those skilled in the art that modifications and variations could be made without departing from the scope of the present invention as defined by the appended claims.

What is claimed is:

1. A semiconductor package, comprising:
 a connection member having a first surface and a second surface opposing each other, and including a first redistribution layer;
 a semiconductor chip disposed on the first surface of the connection member and having connection pads connected to the first redistribution layer;
 an encapsulant disposed on the first surface of the connection member and encapsulating the semiconductor chip;
 a wiring structure connected to the first redistribution layer and extending in a thickness direction of the encapsulant;
 a second redistribution layer disposed on the encapsulant and connected to the wiring structure;
 a mark disposed on the encapsulant and including a plurality of metal patterns providing identification information and a circuit line connected to the second redistribution layer; and
 a passivation layer disposed on an upper surface of the encapsulant to cover the second redistribution layer and the mark and formed of a transparent resin.

2. The semiconductor package of claim 1, wherein the plurality of metal patterns and the second redistribution layer include the same metal.

3. The semiconductor package of claim 1, wherein a width of the circuit line is 10% or less of a width of each of the plurality of metal patterns.

4. The semiconductor package of claim 1, wherein the plurality of metal patterns are a plurality of pixels forming a two-dimensional barcode, respectively.

5. The semiconductor package of claim 4, wherein the mark further includes a metal line surrounding the plurality of pixels, and the metal line and the circuit line form a lattice surrounding the plurality of pixels.

6. The semiconductor package of claim 5, wherein the circuit line is physically separated from the metal line.

7. The semiconductor package of claim 1, wherein the encapsulant includes an opaque resin or a translucent resin.

8. The semiconductor package of claim 1, further comprising an insulating layer disposed on the upper surface of the encapsulant,
wherein the mark and the second redistribution layer are disposed on an upper surface of the insulating layer.

9. The semiconductor package of claim 1, further comprising a frame disposed on the first surface of the connection member and having a cavity in which the semiconductor chip is accommodated,
wherein the wiring structure penetrates through the frame.

10. The semiconductor package of claim 9, further comprising a via penetrating through an extension region of the encapsulant to connect the second redistribution layer and the wiring structure to each other,
wherein the encapsulant includes the extension region covering an upper surface of the frame.

11. The semiconductor package of claim 1, wherein the wiring structure includes a metal post penetrating through the upper surface and a lower surface of the encapsulant.

12. The semiconductor package of claim 1, wherein the plurality of metal patterns of the mark are electrically isolated from the second redistribution layer.

13. The semiconductor package of claim 1, wherein the second redistribution layer and the mark are disposed on a same level with respect to an active surface of the semiconductor chip.

14. A semiconductor package, comprising:
a first connection member having a first surface and a second surface opposing each other and including a first redistribution layer;
a frame disposed on the first surface of the first connection member and having a cavity;
a wiring structure connected to the first redistribution layer and penetrating through an upper surface and a lower surface of the frame;
a semiconductor chip disposed on the first surface of the first connection member and disposed in the cavity of the frame, and having connection pads connected to the first redistribution layer;
an encapsulant disposed on the first surface of the first connection member and encapsulating the semiconductor chip;
a second connection member disposed on the encapsulant and including a second redistribution layer connected to the wiring structure; and
a mark disposed on the second connection member on the same level as a level on which the second redistribution layer is disposed, and formed of a metal,
wherein the mark includes a plurality of metal patterns arranged to form a two-dimensional barcode and a plurality of line patterns forming a lattice surrounding the plurality of metal patterns, and
at least one line pattern of the plurality of line patterns is connected to the second redistribution layer to be provided as a circuit line for the second redistribution layer.

15. The semiconductor package of claim 14, wherein the second connection member includes a first insulating layer disposed on the encapsulant, a lower redistribution layer disposed on the first insulating layer, a second insulating layer disposed on the lower redistribution layer, and an upper redistribution layer disposed on the second insulating layer to be connected to the lower redistribution layer, and the mark is disposed on the second insulating layer.

16. The semiconductor package of claim 15, wherein the plurality of metal patterns of mark completely overlap with portions of the first insulating layer disposed on a level the same as the lower redistribution layer with respect to an active surface of the semiconductor chip.

17. The semiconductor package of claim 15, wherein the second insulating layer is a transparent insulating layer, the second connection member is disposed on the first insulating layer, and the mark further includes a plurality of additional line patterns arranged to overlap with the plurality of line patterns of the mark.

18. The semiconductor package of claim 17, wherein the plurality of additional line patterns are connected to the lower redistribution layer to be provided as circuit lines for the lower redistribution layer.

19. A semiconductor package, comprising:
a connection member having a first surface and a second surface opposing each other, and including a first redistribution layer;
a semiconductor chip disposed on the first surface of the connection member and having connection pads connected to the first redistribution layer;
an encapsulant disposed on the first surface of the connection member and encapsulating the semiconductor chip;
a wiring structure connected to the connection pads of the semiconductor chip through at least the first redistribution layer and extending in a thickness direction of the encapsulant;
a second redistribution layer disposed on the encapsulant and connected to the wiring structure;
a mark region including a plurality of metal patterns disposed on a level the same as that of the second redistribution layer with respect to an active surface of the semiconductor chip; and
a frame disposed on the first surface of the connection member and having a cavity in which the semiconductor chip is accommodated,
wherein the wiring structure penetrates through the frame.

20. The semiconductor package of claim 19, further comprising a circuit line disposed on the level the same as that of the second redistribution layer and the plurality of metal patterns with respect to the active surface of the semiconductor chip, crossing the mark region, electrically isolated from the plurality of metal patterns, and electrically connected to the second redistribution layer.

21. The semiconductor package of claim 20, wherein a width of the circuit line is 10% or less of a width of each of the plurality of metal patterns.

22. The semiconductor package of claim 20, further comprising a plurality of non-metal patterns dispersed among the plurality of metal patterns,
wherein the plurality of non-metal patterns and the plurality of petal patterns form an array.

23. The semiconductor package of claim 22, further comprising a plurality of metal lines,
the plurality of metal lines and the circuit line are disposed between adjacent patterns of the array.

24. The semiconductor package of claim 23, wherein a width of each of the plurality of metal lines is 10% or less of a width of each of the plurality of metal patterns.

25. The semiconductor package of claim 23, further comprising a third redistribution layer disposed between the second redistribution layer and the encapsulant, an additional metal line disposed on a level the same as that of the third redistribution layer with respect to the active surface of the semiconductor chip, extending along the circuit line or along the plurality of metal lines, and electrically connected to the third redistribution layer.

26. The semiconductor package of claim 19, further comprising an insulating layer disposed on an upper surface of the encapsulant,
   wherein the plurality of metal patterns and the second redistribution layer are disposed on an upper surface of the insulating layer.

* * * * *